United States Patent [19]
Ooishi

[11] Patent Number: 5,844,262
[45] Date of Patent: *Dec. 1, 1998

[54] SEMICONDUCTOR DEVICE FOR REDUCING EFFECTS OF NOISE ON AN INTERNAL CIRCUIT

[75] Inventor: Tsukasa Ooishi, Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 626,406

[22] Filed: Apr. 2, 1996

[30] Foreign Application Priority Data

May 25, 1995 [JP] Japan ................................ 7-126726

[51] Int. Cl.⁶ .................................................. H01L 27/10
[52] U.S. Cl. ........................ 257/207; 257/208; 257/691; 307/32; 307/42; 327/530; 327/535; 327/379; 361/110; 361/111; 361/622
[58] Field of Search .................................... 257/207, 208, 257/691; 307/32, 42; 327/530, 379, 535; 361/110, 111, 622

[56] References Cited

U.S. PATENT DOCUMENTS

| | | | |
|---|---|---|---|
| 4,706,105 | 11/1987 | Masuda et al. | 257/695 |
| 5,124,776 | 6/1992 | Tanizawa et al. | 257/204 |
| 5,148,263 | 9/1992 | Hamai | 257/758 |
| 5,235,207 | 8/1993 | Ohi et al. | 257/670 |
| 5,300,798 | 4/1994 | Yamazaki et al. | 257/207 |
| 5,378,925 | 1/1995 | Sasaki | 257/207 X |
| 5,393,996 | 2/1995 | Lang | 257/207 X |
| 5,394,032 | 2/1995 | Conzelmann et al. | 327/525 X |
| 5,517,042 | 5/1996 | Kitamura | 257/207 |
| 5,646,422 | 7/1997 | Hashizume | 257/48 |
| 5,668,389 | 9/1997 | Jassowski et al. | 257/207 |
| 5,670,802 | 9/1997 | Koike | 257/207 |

FOREIGN PATENT DOCUMENTS

| | | |
|---|---|---|
| 0642162A2 | 3/1995 | European Pat. Off. . |
| 19540647 | 10/1996 | Germany . |
| 59-143357 | 8/1984 | Japan ................ 257/207 |
| 61-284953 | 12/1986 | Japan ................ 257/207 |
| 62-106657 | 5/1987 | Japan ................ 257/207 |
| 2251169 | 10/1990 | Japan ................ 257/207 |
| 4199673 | 7/1992 | Japan ................ 257/207 |
| 5-128855 | 5/1993 | Japan . |
| 6120424 | 4/1994 | Japan ................ 257/207 |

OTHER PUBLICATIONS

IBM Technical Disclosure Bulletin, "Decoupling Circuit Structure to Reduce Electrical Noise", vol. 37, No. 09, pp. 593–594, Sep. 1994.

*Primary Examiner*—William Mintel
*Attorney, Agent, or Firm*—McDermott, Will & Emery

[57] ABSTRACT

Semiconductor device according to the present invention includes package frame, bonding wire, pad, first internal power supply line, second internal power supply line, internal circuit, stabilize circuit, GND package frame, GND bonding wire, GND pad, and internal GND line. Bonding wire, pad, and first and second internal power supply lines function as a filter. As a result, noise generated by operation of the internal circuit is absorbed in propagating to the stabilize circuit through first internal power supply line, pad, and the second internal power supply line. Therefore, effects of noise given to the stabilize circuit are small.

35 Claims, 22 Drawing Sheets

1

SEMICONDUCTOR DEVICE FOR REDUCING EFFECTS OF NOISE ON AN INTERNAL CIRCUIT

BACKGROUND OF THE INVENTION

1. Field of the Invention

The present invention relates to semiconductor devices and, more particularly, to a semiconductor device for reducing effects of noise on a circuit in a semiconductor device.

2. Description of the Background Art

A conventional semiconductor device for reducing effects of noise upon an internal circuit is disclosed in, for example, Japanese Patent Laying-Open No. 5-128855.

FIG. 28 is a schematic block diagram showing a conventional semiconductor device.

Referring to FIG. 28, a conventional semiconductor device 5 includes a package frame 1, a bonding wire 3, a pad 11, an internal power supply line 1511, an internal circuit 21, a stabilize circuit 23 which is to be stabilized, a GND package frame 7, a GND bonding wire 9, a GND pad 17, and an internal GND line 19.

Bonding wire 3 has one end connected to package frame 1 and the other end connected to pad 11, which is also connected to internal power supply line 1511. Internal power supply line 1511 is connected to internal circuit 21 and stabilize circuit 23. GND bonding wire 9 has one end connected to GND package frame 7 and the other end connected to GND pad 17, which is also connected to internal GND line 19. Internal GND line is connected to internal circuit 21 and stabilize circuit 23.

Internal circuit 21 and stabilize circuit 23 of semiconductor device 5 receive an externally applied power supply potential through package frame 1, bonding wire 3, pad 11 and internal power supply line 1511. Internal circuit 21 and stabilize circuit 23 of semiconductor device 5 also receive an externally applied power supply potential (such as a ground potential) through GND package frame 7, GND bonding wire 9, GND pad 17 and internal GND line 19, which potential is different from the power supply potential applied through package frame 1.

Internal circuit 21 is provided in semiconductor device 5 and associated with the operations thereof. In other words, it is a circuit which brings about noise, including a word line drive circuit, a data bus drive circuit, and a data output circuit.

Stabilize circuit 23 is easily affected by noise, such as a circuit for controlling a signal of a small analog value and a circuit operating with an extremely small current (for example, on the order of $\mu A$) when semiconductor device 5 is in a standby state. The circuit for controlling a small analog value includes a reference potential generation circuit.

Internal circuit 21 consumes a considerable amount of electric power during operation. As a result, noise is generated at internal power supply line 1511 and internal GND line 19.

FIG. 29 shows the noise level generated when internal circuit 21 of semiconductor device 5 operates.

As indicated by an arrow a, noise of a level lower than that of a power supply potential Vcc is generated at internal power supply line 1511. As indicated by an arrow b, noise of a level higher than a ground potential GND level is generated at internal GND Line 19.

Although such noise is somewhat absorbed by a lowpass filter including an interconnection resistance and a parasitic capacitance of internal power supply line 1511 and a lowpass filter including an interconnection resistance and a parasitic capacitance of internal GND line 19 during propagation to stabilize circuit 23, significant effects are given to stabilize circuit 23.

As described above, a power supply line for applying power supply potential Vcc is common to internal circuit 21 and stabilize circuit 23 in the conventional semiconductor device 5. In other words, power supply potential Vcc is applied to internal circuit 21 and stabilize circuit 23 through internal power supply line 1511. Consequently, noise accompanied with operation of internal circuit 21 is provided to stabilize circuit 23 along with power supply potential Vcc. Therefore, malfunction is undesirably caused at stabilize circuit 23.

Ground potential GND is provided to internal circuit 21 and stabilize circuit 23 through internal GND line 19. Therefore, noise accompanied with operation of internal circuit 21 is also provided to stabilize circuit 23 along with ground potential GND, thereby causing malfunction of stabilize circuit 23.

SUMMARY OF THE INVENTION

The present invention solves the above-described problems, and an object thereof is to provide a semiconductor device capable of reducing effects of noise from an internal circuit causing noise on an internal circuit (stabilize circuit) susceptible to the noise.

Another object of the present invention is to provide a semiconductor device capable of facilitating provision and reception of a voltage at an arbitrary point on the semiconductor device.

A semiconductor device according to a first aspect of the present invention includes a first internal circuit causing noise, a second internal circuit affected by the noise, a first power supply potential provision line for providing the first internal circuit with a first power supply potential, a second power supply potential provision line for providing the second internal circuit with the first power supply potential, and a connection member for connecting the first and second power supply potential provision lines.

In the semiconductor device according to the first aspect of the present invention, the first and second power supply potential provision lines have parasitic resistance and the first connection member has parasitic capacitance, so that they collectively serve as a filter element.

Consequently, noise propagating from the first internal circuit to the second internal circuit through the first power supply potential provision line, the first connection member, and the second power supply potential provision line can be reduced.

As a result, effects of noise given by the first internal circuit to the second internal circuit can be diminished.

A semiconductor device according to a second aspect of the present invention includes a first internal circuit formed on a semiconductor substrate and causing noise, a second internal circuit formed on the semiconductor substrate and affected by the noise, a first power supply potential provision line for providing a first power supply potential, a second power supply potential provision line having one end connected to the first power supply potential provision line and providing the first internal circuit with the first power supply potential, a third power supply potential provision line having one end connected to the first power supply potential provision line for providing the second internal circuit with the first power supply potential, and a first filter provided at the third power supply potential provision line for reducing the noise.

In the semiconductor device according to the second aspect of the present invention, the noise propagated from the first internal circuit to the second internal circuit through the first, the second, and the third power supply potential lines passes through the first filter provided at the third power supply potential provision line.

As a result, the noise propagated from the first internal circuit to the second internal circuit can be reduced.

Consequently, effects of the noise given by the first internal circuit to the second internal circuit is diminished.

A semiconductor device according to a third aspect of the present invention includes a first internal circuit causing noise, a second internal circuit affected by the noise, an internal potential generation circuit for generating an internal potential, a first internal potential provision line for providing the internal potential, a second internal potential provision line having one end connected to the first internal potential provision line for providing the first internal circuit with the internal potential, a third internal potential provision line having one end connected to the first internal potential provision line for providing the second internal circuit with the internal potential, and a filter provided at the third internal potential provision line for reducing the noise.

In the semiconductor device according to the third aspect of the present invention, the noise propagating to the second internal circuit through the first, second and third internal potential provision lines for providing the internal potential generated by the internal potential generation circuit in the semiconductor device passes through the filter provided at the third internal potential provision line.

As a result, the noise propagated from the first internal circuit to the second internal circuit can be reduced.

Consequently, effects of the noise given by the first internal circuit to the second internal circuit is diminished.

A semiconductor device according to a fourth aspect of the present invention includes a first internal circuit causing noise, a second internal circuit affected by the noise, a first internal potential generation circuit for generating a first internal potential provided to the first internal circuit, a second internal potential generation circuit for generating a second internal potential provided to the second internal circuit, a power supply potential provision line for providing a power supply potential to the first and second internal potential generation circuits, a first internal potential provision line for providing the first internal circuit with the first internal potential, and a second internal potential provision line for providing the second internal circuit with the second internal potential.

In the semiconductor device according to the fourth aspect of the present invention, the first internal potential generation circuit provides the first internal potential to the first internal circuit through the first internal potential provision line. The second internal potential generation circuit provides the second internal potential to the second internal circuit through the second internal potential provision line.

Thus, the first internal potential provision line for providing the first internal potential and the second internal potential provision line for providing the second internal potential are disposed separately.

Therefore, noise does not directly propagate from the first internal circuit to the second internal circuit. Furthermore, the first and second internal potential generation circuits serve as a filter and the noise propagating from the first internal circuit to the second internal circuit through the power supply potential provision line can be reduced.

Consequently, effects of the noise given by the first internal circuit to the second internal circuit through the power supply provision line is diminished.

A semiconductor device according to a fifth aspect of the present invention includes a first internal circuit causing noise, a second internal circuit affected by the noise, a first internal potential generation circuit for generating a first internal potential provided to the first internal circuit, a first internal potential provision line for providing the first internal potential to the first internal circuit, a second internal potential generation circuit for generating a second internal potential provided to the second internal circuit or the first and second internal circuits, a second internal potential provision line for providing the second internal potential to the second internal circuit or the first and second internal circuits, and a connection control circuit for controlling connection between the first internal circuit and the first or second internal potential provision line in accordance with the state of the semiconductor device.

In the semiconductor device according to the fifth aspect of the present invention, the connection control circuit controls connection of the first internal circuit with the first or second internal potential provision line in accordance with a state of the semiconductor device. More specifically, the connection control circuit can disconnect the first internal circuit and the second internal potential provision line when the first internal circuit generates noise.

Therefore, noise does not propagate directly from the first internal circuit to the second internal circuit through the second internal potential provision line.

As a result, the second internal circuit will not be directly affected by the noise through the second internal potential provision line.

A semiconductor device according to a sixth aspect of the present invention includes a first internal circuit causing noise, a second internal circuit affected by the noise, a first internal potential generation circuit for generating a first internal potential provided to the first and second internal circuits when the semiconductor device is in an operative state, a second internal potential generation circuit for generating a second internal potential provided to the first and second internal circuits when the semiconductor device is in an operative or standby state, a first internal potential provision line for providing the first internal potential, a second internal potential provision line for providing the second internal potential, a third internal potential provision line connected between the first and second internal potential provision lines, and a filter provided at the third internal potential provision line for reducing the noise, and the third internal potential provision line provides the second internal potential or the first and second internal potentials.

In the semiconductor device according to the sixth aspect of the present invention, the noise generated when the semiconductor device is in an operative state, i.e. when the first internal circuit is in an operative state, is reduced by the filter provided at the third internal potential provision line before reaching the second internal circuit.

As a result, effects of the noise given to the second internal circuit is diminished.

A semiconductor device according to a seventh aspect of the present invention includes a first internal circuit causing first noise, a second internal circuit affected by the first noise, a first internal potential generation circuit for generating a first internal potential provided to the first internal circuit, a second internal potential generation circuit for generating a second internal potential provided to the second internal circuit, a first internal potential provision line for connecting the first internal potential generation circuit and the first internal circuit and providing the first internal potential, a second internal potential provision line for connecting the second internal potential generation circuit and the second internal circuit and providing the second internal potential, and a first connection control circuit provided between the first and second internal potential provision lines and controlling connection between the first and second internal potential provision lines in accordance with a state of the semiconductor device.

In the semiconductor device according to the seventh aspect of the present invention, the first connection control means controls the connection between the first and second internal potential provision lines in accordance with the state of the semiconductor device. More specifically, the first connection control circuit can disconnect the first and second internal potential provision lines when the first internal circuit generates the first noise.

As a result, the first noise will not directly propagate to the second internal circuit through the first and second internal potential provision lines.

Consequently, the second internal circuit will not be directly affected by noise through the first and second internal potential provision lines.

A semiconductor device according to an eighth aspect of the present invention includes a first internal circuit affected by noise, a first potential provision member for providing a potential to the first internal circuit, an internal lead connect in series with the first potential provision member for providing the potential to the first internal circuit, and a second potential provision member connected in series with the internal lead and providing the potential to the first internal circuit. The internal lead does not have a connection portion with the outside of the semiconductor device for providing and receiving a voltage to and from the outside of the device, and is thicker than an internal interconnection of the semiconductor device.

In the semiconductor device according to the eighth aspect of the present invention, noise is propagated to the first internal circuit to the first potential provision member, the internal lead, and the second potential provision member.

By thus passing through a plurality of paths, the noise propagating to the first internal circuit is diminished.

As a result, effects of noise on the second internal circuit is diminished.

A semiconductor device according to a ninth aspect of the present invention includes an external lead for directly providing and receiving a voltage to and from the outside of the semiconductor device, and having a contact portion with the outside, and an internal lead for directly providing and receiving a voltage to and from the outside of the device and not having a contact portion with the outside. The external lead and the internal lead are thicker than an internal interconnection of the semiconductor device.

In the semiconductor device according to the ninth aspect of the present invention, an internal lead having a great freedom in arrangement is provided in the semiconductor device.

As a result, a voltage can be provided and received in the semiconductor device through the internal lead.

Since the internal lead is thicker than the internal interconnection of the semiconductor device, resistance of the internal lead is smaller than that of the internal interconnection of the semiconductor device.

Therefore, voltage drop is reduced when the source of the voltage and the receptor of the voltage are remote from each other, as compared to the case where the voltage is provided and received only through the internal interconnection.

As a result, malfunction of the semiconductor device can be prevented.

Preferably, the external lead is provided at a first layer and the internal layer is provided at a second layer. Thus, the external lead and the internal lead are provided at different layers, so that the external lead and the internal lead can be disposed without considering the contact therebetween. In other words, the external lead and the internal lead can be disposed more freely.

More preferably, the internal lead includes a first internal lead and a plurality of second internal leads branched from the first internal lead. Thus, a voltage can be conveyed more easily between the internal lead and an arbitrary point of the semiconductor device.

More preferably, the semiconductor device further includes an internal circuit for providing and receiving a voltage to and from the internal lead, the external lead and the internal lead are provided at an upper layer of the internal circuit so as not to directly contact the internal circuit, and the device further includes a connection member for connecting the internal lead and the internal circuit to avoid contact with the external lead.

Thus, the external lead and the internal lead are provided at an upper layer of the internal circuit to avoid direct contact between the internal circuit and the external and internal leads. The connection member can be provided as desired to the internal lead having a great freedom in arrangement.

As a result, a voltage can be conveyed easily between the internal lead and an arbitrary point of the internal circuit avoiding contact with the external lead.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, embodiments of the present invention will be described with reference to the drawings.

Embodiment 1

Figure 1:
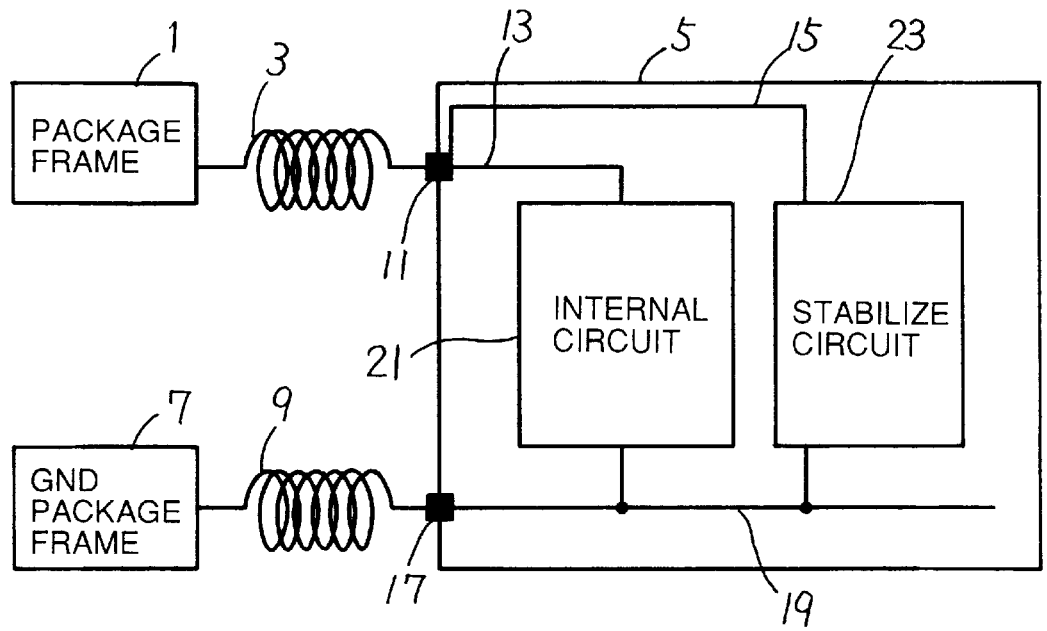
FIG. 1 is a schematic block diagram showing a semiconductor device according to a first embodiment of the present invention.

FIG. 1 is a schematic block diagram showing a semiconductor device according to a first embodiment of the present invention.

Figure 28:
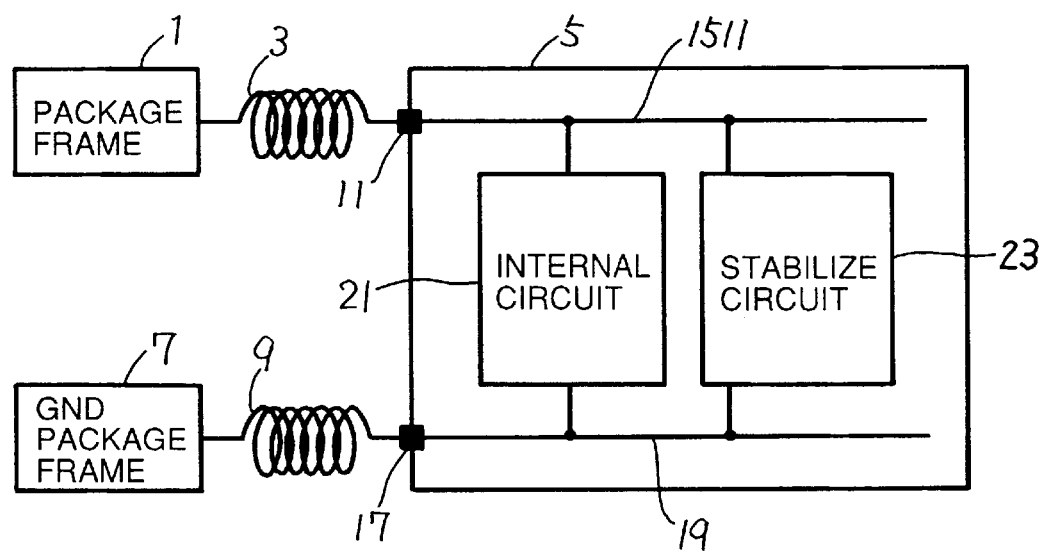
FIG. 28 is a schematic block diagram showing a conventional semiconductor device.
Figure 29:
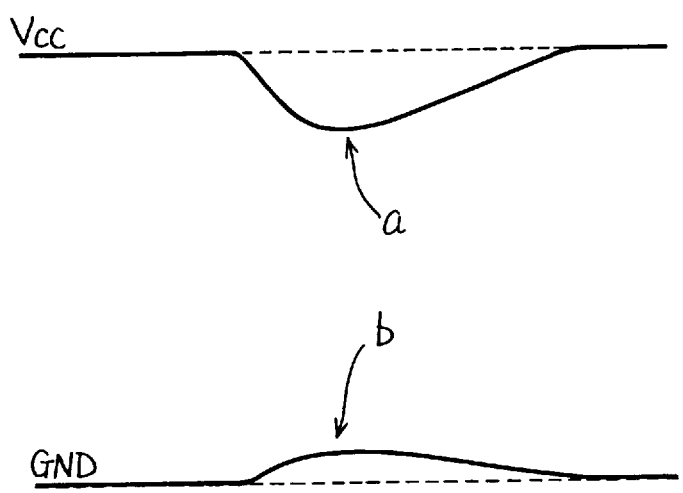
FIG. 29 shows the noise level generated during operation of an internal circuit in FIG. 28.

Semiconductor device 5 according to the first embodiment of the present invention includes package frame 1, bonding wire 3, pad 11, first and second internal power supply lines 13 and 15, internal circuit 21, stabilize circuit 23, GND package frame 7, GND bonding wire 9, GND pad 17, and internal GND line 19. The portion identical to those in FIG. 28 are indicated by the same reference numerals and description thereof will not be repeated.

The externally applied power supply potential Vcc is provided to internal circuit 21 through package frame 1, bonding wire 3, pad 11 and first internal power supply line 13. The externally applied power supply potential Vcc is also provided to stabilize circuit 23 through package frame 1, bonding wire 3, pad 11, and second internal power supply line 15. In other words, internal circuit 21 and stabilize circuit 23 receive power supply potential Vcc from different power supply lines divided from pad 11.

As a result, internal circuit 21 and stabilize circuit 23 are connected through pad 11, thereby forming a long propagation path for the noise caused by operation of internal circuit 21. In addition, internal circuit 21 causing noise and stabilize circuit 23 are located in parallel to each other.

Therefore, the noise caused by operation of internal circuit 21 and propagated to stabilize circuit 23 is reduced. If a decoupling capacitor is added at the base of first and second internal power supply lines 13 and 15 (the connection portion with pad 11), propagation of the noise to stabilize circuit 23 can further be reduced.

The reason for reduction in noise caused by internal circuit 21 and propagated to stabilize circuit 23 will be described below in detail. Generally, the transmitted noise is attenuated at a connection point between resistance component (R component) and capacitance component (C component). The amount of attenuation in noise is in proportion to the product of resistor component and capacitance component. The attenuation effects of noise is greater when a great capacitance component is added at a point where the noise passes.

In FIG. 1, a great capacitance component is added to pad 11. The resistor component includes first and second internal power supply lines 13 and 15.

If inductance component (L component) is added to resistor component and capacitance component, the attenuation effects of the noise is increased even further. This is because a reverse current is generated when a current flows through the inductance component to eliminate the current generated by noise. In FIG. 1, the inductance component due to bonding wire 3 connected to pad 11 enhances the attenuation effects of noise. The attenuation effects of noise is increased as the inductance component becomes greater.

As described above, in the semiconductor device according to the first embodiment of the present invention, the internal power supply line providing power supply potential Vcc to internal circuit 21 and stabilize circuit 23 is divided into two from the portion of pad 11.

Therefore, in the semiconductor device according to the first embodiment of the present invention, noise is propagated to stabilize circuit 23 through pad 11, and pad 11 and first and second internal power supply lines 13 and 15 collectively serve as a filter, thereby reducing noise propagated to stabilize circuit 23.

Figure 2:
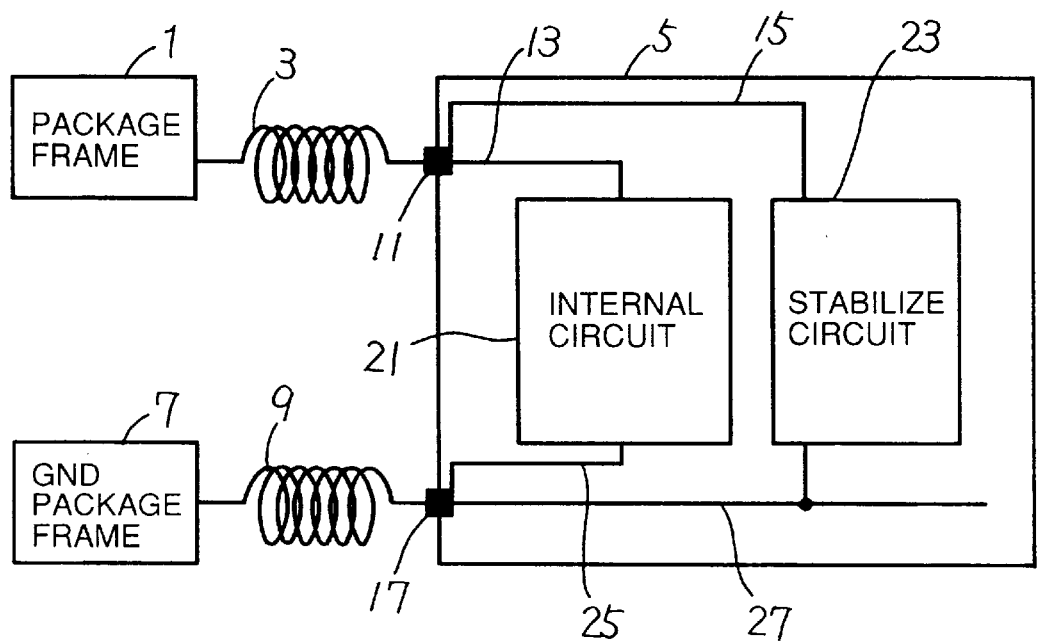
FIG. 2 is a schematic block diagram showing a modification of the semiconductor device according to the first embodiment of the present invention.

FIG. 2 is a schematic block diagram showing a modification of the semiconductor device according to the first embodiment of the present invention.

The modification of the semiconductor device according to the first embodiment of the present invention includes package frame 1, bonding wire 3, pad 11, first and second internal power supply lines 13 and 15, internal circuit 21, stabilize circuit 23, GND package frame 7, GND bonding wire 9, GND pad 17, and first and second internal GND lines 25 and 27. The portions identical to those in FIG. 1 are indicated by the same reference numerals and description thereof will not be repeated.

Referring to FIG. 2, a ground potential GND is provided to internal circuit 21 through GND package frame 7, GND bonding wire 9, GND pad 17 and first internal GND line 25. Ground potential GND is applied to stabilize circuit 23 through GND package frame 7, GND bonding wire 9, GND pad 17 and second internal GND line 27. In other words, ground potential GND is provided to internal circuit 21 and stabilize circuit 23 through different internal power supply lines divided at GND pad 17 portion. Therefore, for the same reason as described above, noise caused by operation of internal circuit 21 and propagating to stabilize circuit 23 is reduced.

As described above, in the modification of the semiconductor device according to the first embodiment of the present invention, the internal power supply line providing power supply potential Vcc to internal circuit 21 and stabilize circuit 23 is divided at pad 11, and the internal GND line providing ground potential GND to internal circuit 21 and stabilize circuit 23 is also divided.

Therefore, in the modification of semiconductor device according to the first embodiment of the present invention, the noise propagating to stabilize circuit 23 can be reduced even further as compared to the semiconductor device according to the first embodiment.

Embodiment 2

Figure 3:
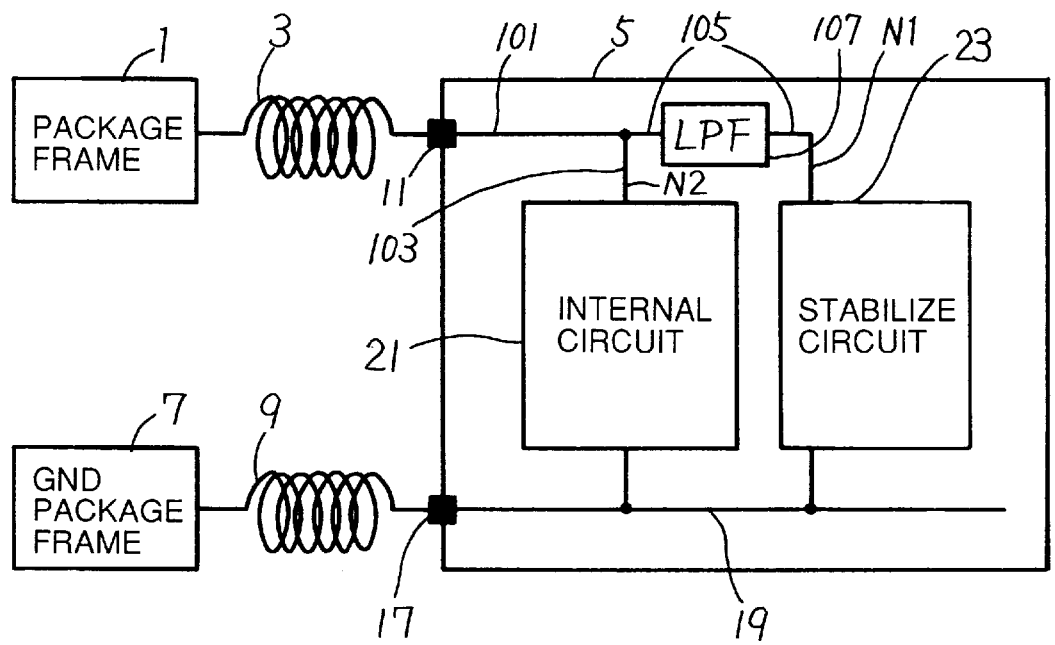
FIG. 3 is schematic block diagram showing a semiconductor device according to a second embodiment of the present invention.

FIG. 3 is a schematic block diagram showing a semiconductor device according to a second embodiment of the present invention.

Referring to FIG. 3, semiconductor device 5 according to the second embodiment of the present invention includes the package frame 1, bonding wire 3, pad 11, first, second and third internal power supply lines 101, 103 and 105, a lowpass filter (LPF) 107, internal circuit 21, stabilize circuit 23, GND package frame 7, GND bonding wire 9, GND pad 17, and internal GND line 19. The portion identical to those in FIG. 1 are indicated by the same reference numerals and description thereof will not be repeated.

The externally applied power supply potential Vcc is provided to internal circuit 21 through package frame 1, bonding wire 3, pad 11, and first and second internal power supply lines 101 and 103. The externally applied power supply potential Vcc is provided to stabilize circuit 23 through package frame 1, bonding wire 3, pad 11, and first and third internal power supply lines 101 and 105. Power supply potential Vcc is provided to stabilize circuit 23 through lowpass filter (LPF) 107 provided at third internal power supply line 105.

Thanks to this lowpass filter 107, noise caused by operation of internal circuit 21 propagating to stabilize circuit 23 along with the power supply potential is reduced.

Figure 4:
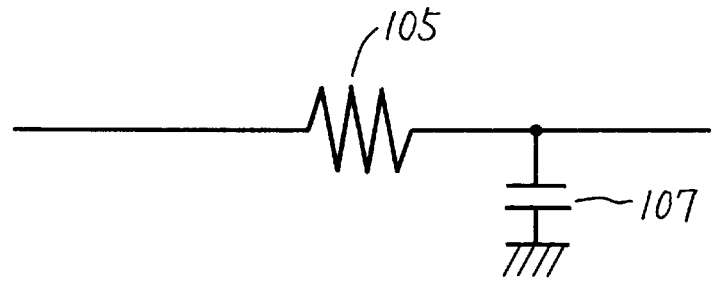
FIG. 4 is circuit diagram showing in detail a lowpass filter (LPF) shown in FIG. 3.

FIG. 4 is a circuit diagram showing lowpass filter 107 in FIG. 3 in detail. Referring to FIG. 4, lowpass filter 107 shown in FIG. 3 includes a resistor 105 and a capacitor 107. If a decoupling capacitor is added to both ends of lowpass filter 107, the effects of reduction in noise can be enhanced even further.

Description will now be made in detail of the effects of reduction in noise propagating to stabilize circuit 23 given by lowpass filter 107.

Figure 5:
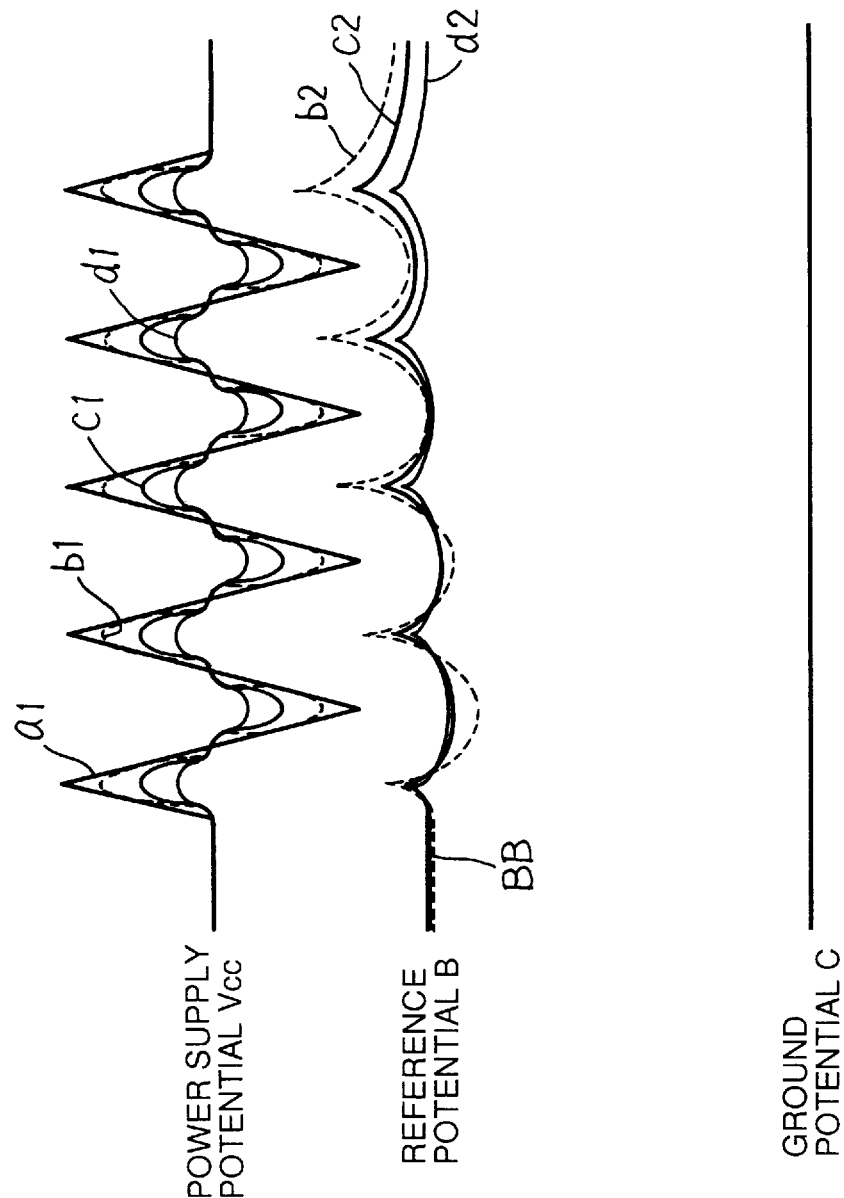
FIG. 5 shows the noise affecting a stabilize circuit in FIG. 3 with and without a lowpass filter for comparison.

FIG. 5 shows, for comparison, the noise affecting stabilize circuit 23 in FIG. 3 when lowpass filter 107 is used and is not used.

Referring to FIG. 5, a line a1 indicates the noise generated at the portion of internal circuit 21. A voltage of ±1 V is periodically applied, as noise, around power supply potential Vcc of 5 V. More specifically, it is assumed that the noise indicated by line a1 appears at power supply potential Vcc during operation of internal circuit 21 and lowpass filter 107 is used. A line b1 indicates the potential of a node N1 in FIG. 3 obtained when noise indicated by line a1 appears at power supply potential Vcc in internal circuit 21 without lowpass filter 107.

Lines c1 and d1 indicate the potentials of node N1 in FIG. 3 when noise indicated by line a1 appears at power supply potential Vcc in internal circuit 21 and lowpass filter 107 is used. For line c1, it is assumed that the resistance value of resistor 105 is 4 KΩ and the capacitance of capacitor 107 is 100 pF, forming lowpass filter 107. For line d1, it is assumed that lowpass filter 107 is formed by the resistor in FIG. 4 having the resistance value of 10 KΩ and the capacitor with the capacitance value of 300 pF.

As described above, the noise propagated to node N1 in FIG. 3 is reduced with lowpass filter 107 (lines c1 and d1) as compared to the case where lowpass filter 107 is not used (line b1). When the resistance value of resistor 105 and the capacitance of capacitor 107 forming lowpass filter 107 are greater (line d1), noise at node N1 shown in FIG. 3 is reduced as compared to the case where these values are small (line c1).

In FIG. 5, a reference potential B is the reference potential generated by a reference potential generation circuit as stabilize circuit 23. A line b2 indicates the reference potential generated by the reference potential generation circuit as stabilize circuit 23 when power supply potential Vcc indicated by line b1 is applied to stabilize circuit 23. A line c2 indicates the reference potential generated by the reference potential generation circuit as stabilize circuit 23 when power supply potential Vcc indicated by line c1 is applied to circuit 23. A line d2 indicates the reference potential generated by the reference potential generation circuit as stabilize circuit 23 when power supply potential Vcc of line d1 is applied to stabilize circuit 23.

In other words, reference potential B indicates by line b2 is the reference potential generated by the reference potential generation circuit serving as stabilize circuit 23 when lowpass filter 107 is not provided. Reference potential B indicated by lines c2 and d2 indicates the reference potential generated by the reference potential generation circuit as stabilize circuit 23 when lowpass filter 107 is used. For line c2, it is assumed that the resistance value of resistor 105 is 4 KΩ and the capacitance of capacitor 107 is 100 pF in lowpass filter 107. For line d2, the resistance value of resistor 105 is 10 kΩ and the capacitance of capacitor 107 is 300 pF in lowpass filter 107.

Thus, fluctuation in level of reference potential B generated by the reference potential generation circuit as stabilize circuit 23 is reduced with lowpass filter 107 (lines c2 and d2) as compared to the case where lowpass filter 107 is not used (line b2). In addition, fluctuation in level of reference potential B is further reduced with the greater resistance of resistor 105 and greater capacitance of capacitor 107 in lowpass filter 107 (line d2) as compared to the case where these values are small (line c2). In FIG. 5, ground potential C indicates the ground potential.

Figure 6:
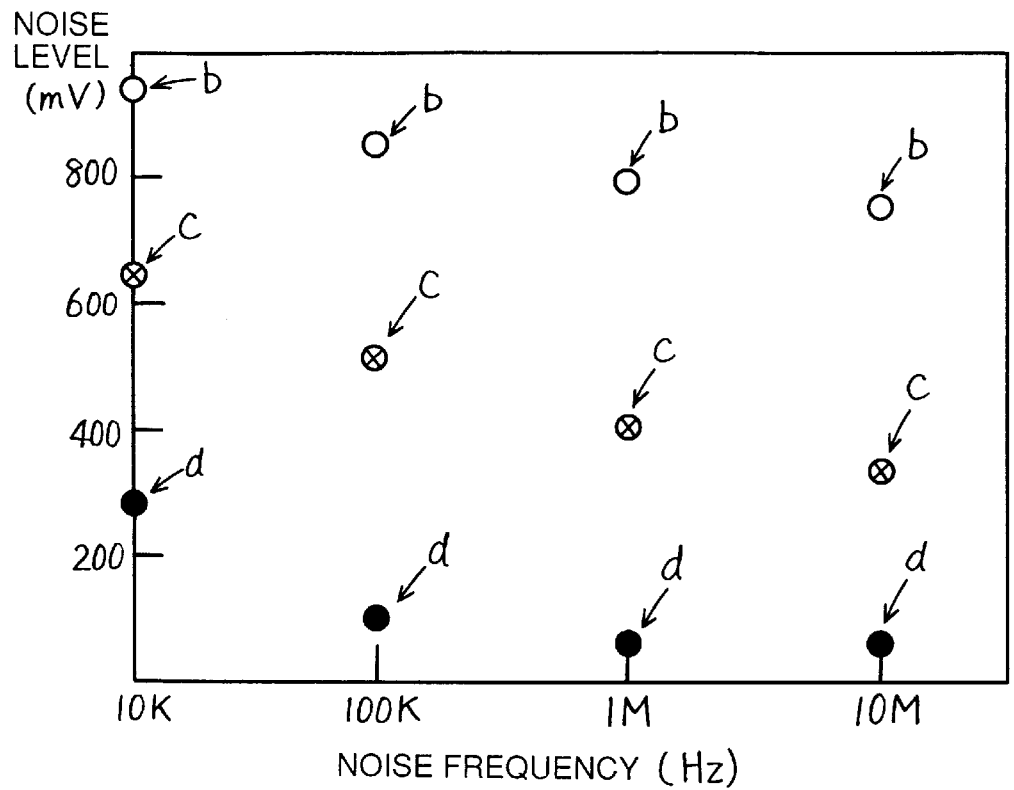
FIG. 6 shows the noise level, appearing at a reference potential generated by a reference potential generation circuit as a stabilize circuit, obtained when the frequency of the noise indicated by a line al in FIG. 5 is changed.

FIG. 6 shows the noise level appearing at the reference potential generated by the reference potential generation circuit as stabilize circuit 23 when the frequency of noise indicated by line al in FIG. 5 is changed.

In FIG. 6, the vertical axis shows noise level and the horizontal axis shows noise frequency. The noise level shown in FIG. 6 is an absolute value of the difference between a potential level BB of reference potential B in FIG.

5 and the peak value of noise. In FIG. 6, a point indicated by an arrow b shows the noise level without lowpass filter 107. Points indicated by arrows c and d show the noise levels with lowpass filter 107.

For the points indicated by arrow c, it is assumed that the resistance value of resistor 105 is 4 KΩ and the capacitance of capacitor 107 is 100 pF in lowpass filter 107. For the points indicated by arrow d, the resistance value of the resistor in lowpass filter 107 is 10 KΩ and the capacitance of capacitor 107 is 300 pF.

As shown in FIG. 6, the noise level appearing at the reference potential generated by the reference potential generation circuit as stabilize circuit 23 is reduced as the noise frequency increases.

As shown by line a1 in FIG. 5, power supply potential Vcc applied to the reference potential generation circuit as stabilize circuit 23 is affected by the noise at internal circuit 21 and is considerably fluctuated. Although the fluctuation in power supply potential Vcc at internal circuit 21 is somewhat absorbed even without lowpass filter 107 by the capacitance component and the resistor component parasitic to the internal power supply line providing power supply potential Vcc, the absorbed amount is small. Therefore, if lowpass filter 107 is not provided, the fluctuation in power supply potential Vcc affects the reference potential generation circuit as stabilize circuit 23 and the output thereof is greatly fluctuated, as shown by line b2 in FIG. 5.

As described above, in the semiconductor device according to the first embodiment of the present invention, lowpass filter 107 is provided at third internal power supply line 105 for providing stabilize circuit 23 with power supply potential Vcc, thereby absorbing noise appearing at power supply potential Vcc provided to stabilize circuit 23. In other words, in the semiconductor device according to the second embodiment of the present invention, noise caused by operation of internal circuit 21 and propagating to stabilize circuit 23. is reduced by providing lowpass filter 107.

Figure 7:
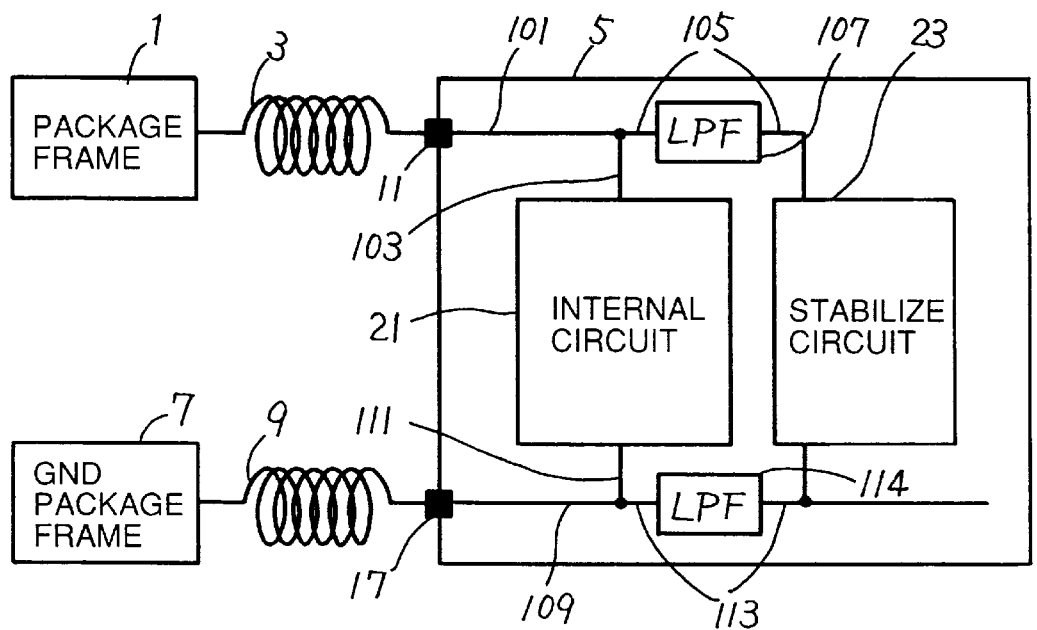
FIG. 7 is a schematic block diagram showing a modification of the semiconductor device according to the second embodiment of the present invention.

FIG. 7 is a schematic block diagram showing a modification of the semiconductor device according to the second embodiment of the present invention.

Referring to FIG. 7, the modification of the semiconductor device according to the second embodiment of the present invention includes package frame 1, bonding wire 3, pad 11, first, second and third internal power supply lines 101, 103 and 105, lowpass filter (LPF) 107, internal circuit 21, stabilize circuit 23, GND package frame 7, GND bonding wire 9, GND pad 17, first, second and third internal GND lines 109, 111 and 113 and a lowpass filter (LPF) 114. The portions identical to those in FIG. 3 are indicated by the identical reference numerals and description thereof will not be repeated.

Ground potential GND is applied to internal circuit 21 through GND package frame 7, GND bonding wire 9, GND pad 17, and first and second internal GND lines 109 and 111. Ground potential GND is also applied to stabilize circuit 23 through GND package frame 7, GND bonding wire 9, GND pad 17, and first and third internal GND lines 109 and 113.

Lowpass filter 114 is provided at third internal GND line 113, and ground potential GND is applied to stabilize circuit 23 through lowpass filter 114. Lowpass filter 114 is similar in structure to lowpass filter 107.

More specifically, noise caused by internal circuit 21 is absorbed by lowpass filter 114, whereby noise propagating to stabilize circuit 23 along with ground potential GND is reduced.

As described above, in the modification of the semiconductor device according to the first embodiment of the present invention, lowpass filter 107 is provided at third internal power supply line 105 and lowpass filter 114 is also provided at third internal GND line 113. As a result, noise propagation to stabilize circuit 23 is further reduced as compared to the semiconductor device shown in FIG. 3 according to the first embodiment. Although a passive filter consisting of a resistor and a capacitor is employed for lowpass filters 107 and 114 shown in FIGS. 3 and 7, other passive filters may also be employed, or an active filter can also be employed.

The lowpass filter employed in the first embodiment and in the modification of the first embodiment can also be employed at the internal power supply line of the first embodiment shown in FIGS. 1 and 2.

Embodiment 3

Figure 8:
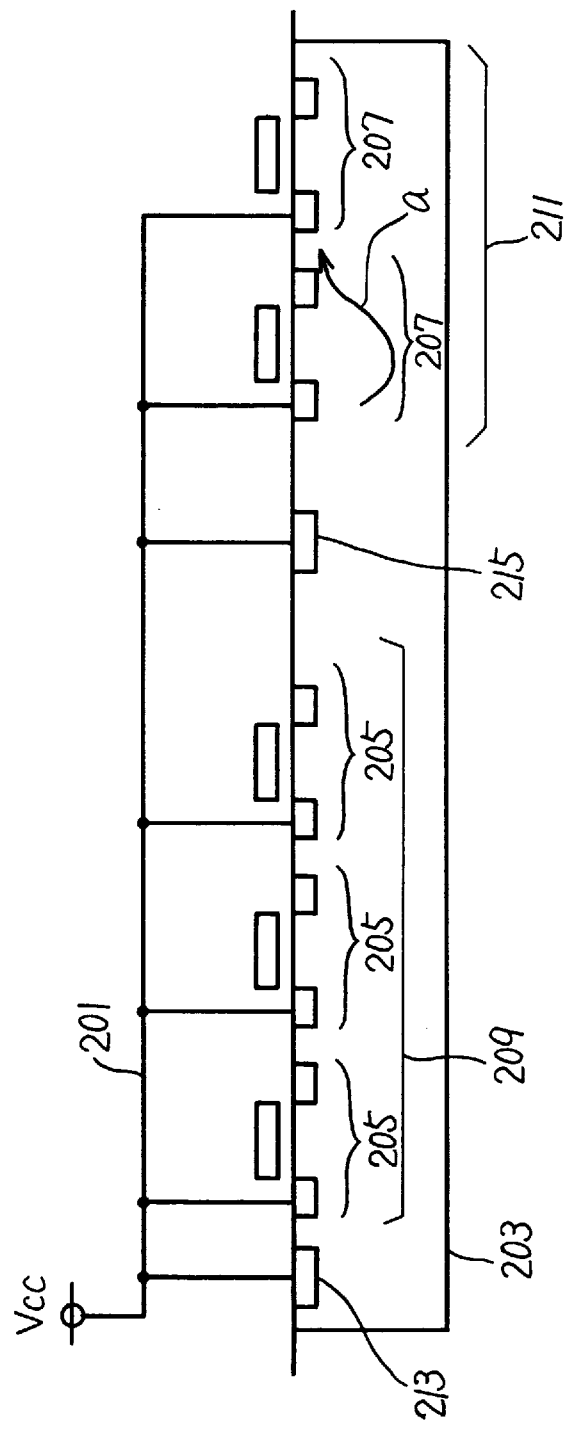
FIG. 8 is a schematic block diagram showing a general semiconductor device.

FIG. 8 is a schematic block diagram showing a general semiconductor device.

Referring to FIG. 8, the general semiconductor device includes a well 203, transistors 205 and 207, a well-fixing diffusion layer 213 for an internal circuit, a well-fixing diffusion layer 215 for a stabilize circuit, and an internal power supply line 201. A plurality of transistors 205 form an internal circuit 209. A plurality of transistors 207 form a stabilize circuit 211.

Internal circuit 209 receives power supply potential Vcc through internal power supply line 201. Stabilize circuit 211 receives power supply potential Vcc through internal power supply line 201. Internal circuit well-fixing diffusion layer 213 fixes a well in a region where internal circuit 209 is formed to the power supply potential. The stabilize circuit well-fixing diffusion layer fixes to power supply potential Vcc a well in a region where stabilize circuit 211 is formed.

In such a general semiconductor device, noise caused by operation of internal circuit 209 is undesirably propagated to stabilize circuit 211 through diffusion layers 213 and 215, thereby causing malfunction of stabilize circuit 211. Furthermore, noise caused by operation of internal circuit 209 directly propagates to stabilize circuit 211 through internal power supply line 201. The third embodiment solves such problems.

Figure 9:
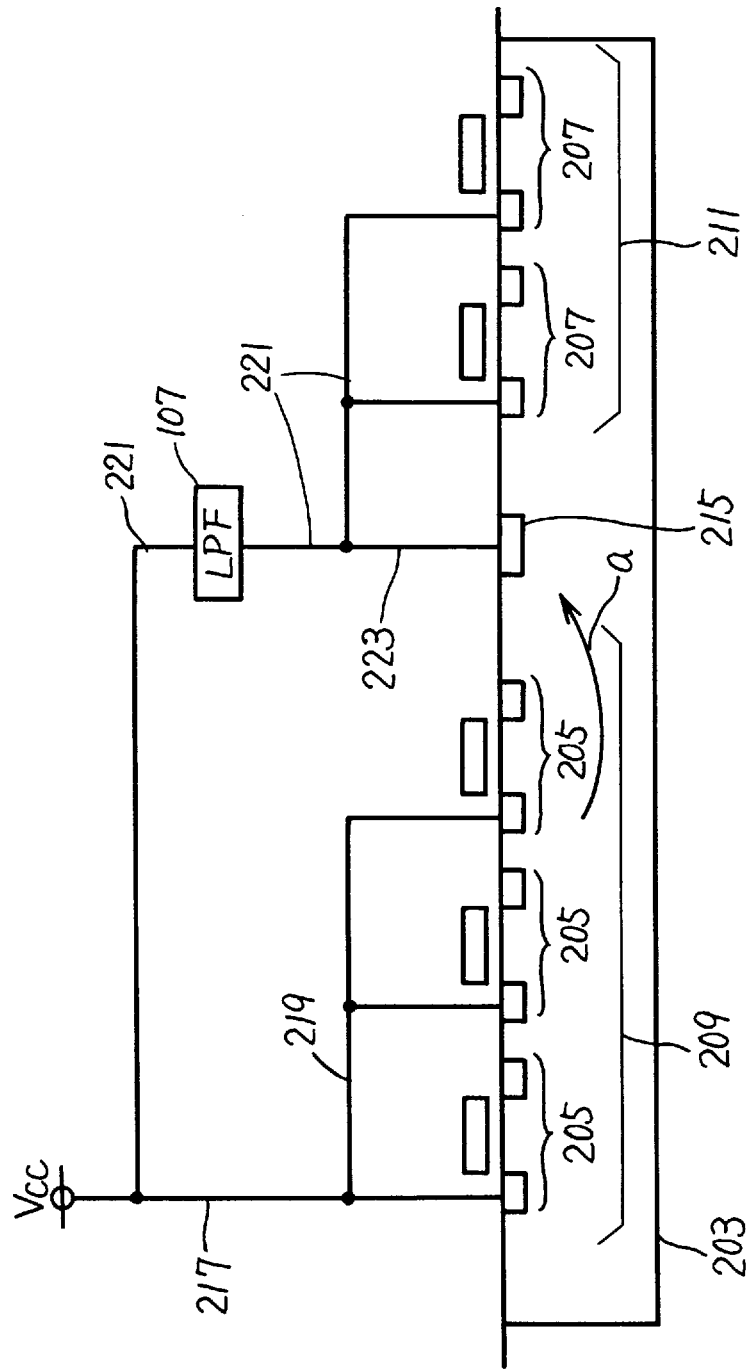
FIG. 9 is a schematic block diagram showing a semiconductor device according to a third embodiment of the present invention.

FIG. 9 is a schematic block diagram showing a semiconductor device according to the third embodiment. Referring to FIG. 9, the semiconductor device according to the third embodiment of the present invention includes well 203, transistors 205 and 207, well-fixing diffusion layer 215 for a stabilize circuit, lowpass filter (LPF) 107, and first, second, third and fourth internal power supply lines 217, 219, 221 and 223.

A plurality of transistors 205 form internal circuit 209. A plurality of transistors 207 form stabilize circuit 211. Internal circuit 209 and stabilize circuit 211 are similar in nature to internal circuit 25 and stabilize circuit 23 in FIG. 1. The portions identical to those in FIG. 8 are indicated by the identical reference numerals and description thereof will not be repeated. Lowpass filter 107 is similar in structure to lowpass filter 107 in FIG. 3.

Internal circuit 209 receives power supply potential Vcc through first and second internal power supply lines 217 and 219. Stabilize circuit 211 receives power supply potential Vcc through first and third internal power supply lines 217 and 221. Diffusion layer 215 receives power supply potential Vcc through first, third and fourth internal power supply lines 217, 221 and 223.

It should be noted that power supply potential Vcc is provided to stabilize circuit 211 and diffusion layer 215 through lowpass filter 107 because lowpass filter 107 is provided at third internal power supply line 221. More specifically, noise caused by operation of internal circuit 209 is absorbed by lowpass filter 107 in propagating to diffusion layer 215 and stabilize circuit 211 through first, second and third internal power supply lines 217, 219 and 221.

As described above, in the semiconductor device according to the third embodiment of the present invention, the internal power supply line (third internal power supply line 221) providing power supply potential Vcc to the stabilize circuit well-fixing diffusion layer and stabilize circuit 211 is disposed separately from the internal power supply line (second internal power supply line 219) providing power supply potential Vcc to internal circuit 209, and lowpass filter 107 is provided at third internal power supply line 221.

Thus, noise accompanied with operation of internal circuit 209 and propagating to stabilize circuit 211 through the internal power supply lines (first, second and third internal power supply lines 217, 219 and 221) is attenuated by lowpass filter 107, giving no effects on stabilize circuit 211. Furthermore, the noise is absorbed by lowpass filter 107 in propagating to diffusion layer 215 through the internal power supply lines (first, second, third and fourth internal power supply lines 217, 219, 221, and 223). As a result, the noise propagating through diffusion layer 215 to stabilize circuit 211 is reduced.

Furthermore, only the extremely small noise from the diffusion layer, connected to the internal power supply line (second internal power supply line 219) for providing internal circuit 209 with power supply potential Vcc, is propagated to stabilize circuit 211, so that stabilize circuit 211 is less affected by the noise accompanied with operation of internal circuit 209. By fixing a well between internal circuit 209 and stabilize circuit 211 with diffusion layer 215 connected to the internal power supply line (fourth internal power supply line 223) through lowpass filter 107, the propagated noise (arrow a) is absorbed by the noise-less potential of fourth internal power supply line 223.

Figure 10:
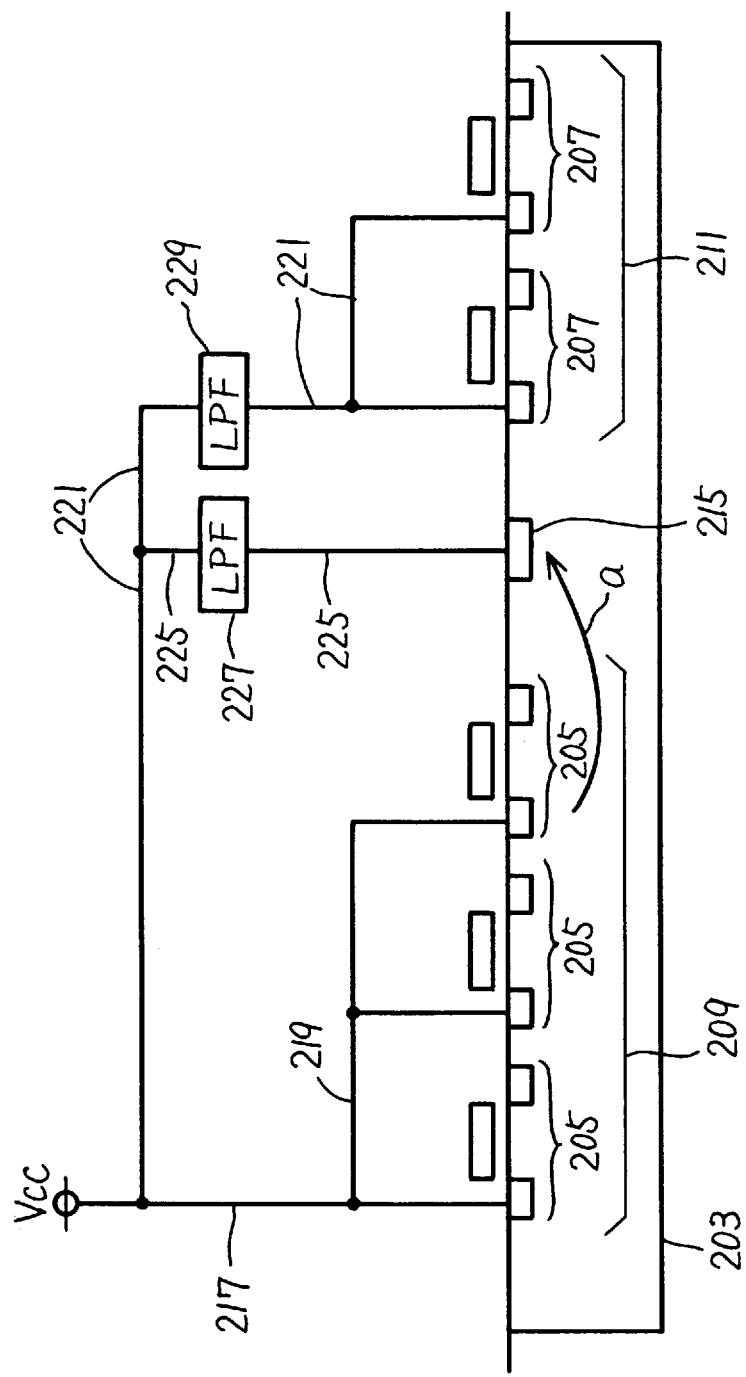
FIG. 10 is a schematic block diagram showing a modification of the semiconductor device according to the third embodiment of the present invention.

FIG. 10 is a schematic block diagram showing a modification of the semiconductor device according to the third embodiment of the present invention.

Referring to FIG. 10, the modification according to the third embodiment of the present invention includes well 203, transistors 205 and 207, well-fixing diffusion layer 215 for the stabilize circuit, lowpass filters 227 and 229, and first, second, third and fourth internal power supply lines 217, 219, 221 and 225. The portions identical to those in FIG. 9 are indicated by the identical reference numerals and description thereof will not be repeated. Lowpass filters 227 and 229 are similar in structure to lowpass filter 107 in FIG. 9.

In FIG. 10, diffusion layer 215 receives power supply potential Vcc through first, third and fourth internal power supply lines 217, 221 and 225. Lowpass filter 227 is provided at fourth internal power supply line 225.

Thus, noise caused by operation of internal circuit 209 is propagated to diffusion layer 215 through lowpass filter 227. Therefore, noise propagated to diffusion layer 215 is reduced. Power supply potential Vcc is also applied to stabilize circuit 211 through lowpass filter 229. As a result, noise propagated to stabilize circuit 211 is absorbed by lowpass filter 229, so that stabilize circuit 211 is less affected by the noise.

As described above, in the modification according to the third embodiment of the present invention, lowpass filters 227 and 229 are provided at fourth internal power supply line 225 providing power supply potential Vcc to diffusion layer 215 and at third internal power supply line 221 providing power supply potential Vcc to stabilize circuit 211, respectively. Therefore, the same effects can be obtained in the modification of the third embodiment as in the embodiment shown in FIG. 9.

Using a lowpass filter at the internal power supply line for providing power supply line Vcc to the well-fixing diffusion layer for a stabilize circuit can be applied to the first and second embodiments.

Embodiment 4

Figure 11:
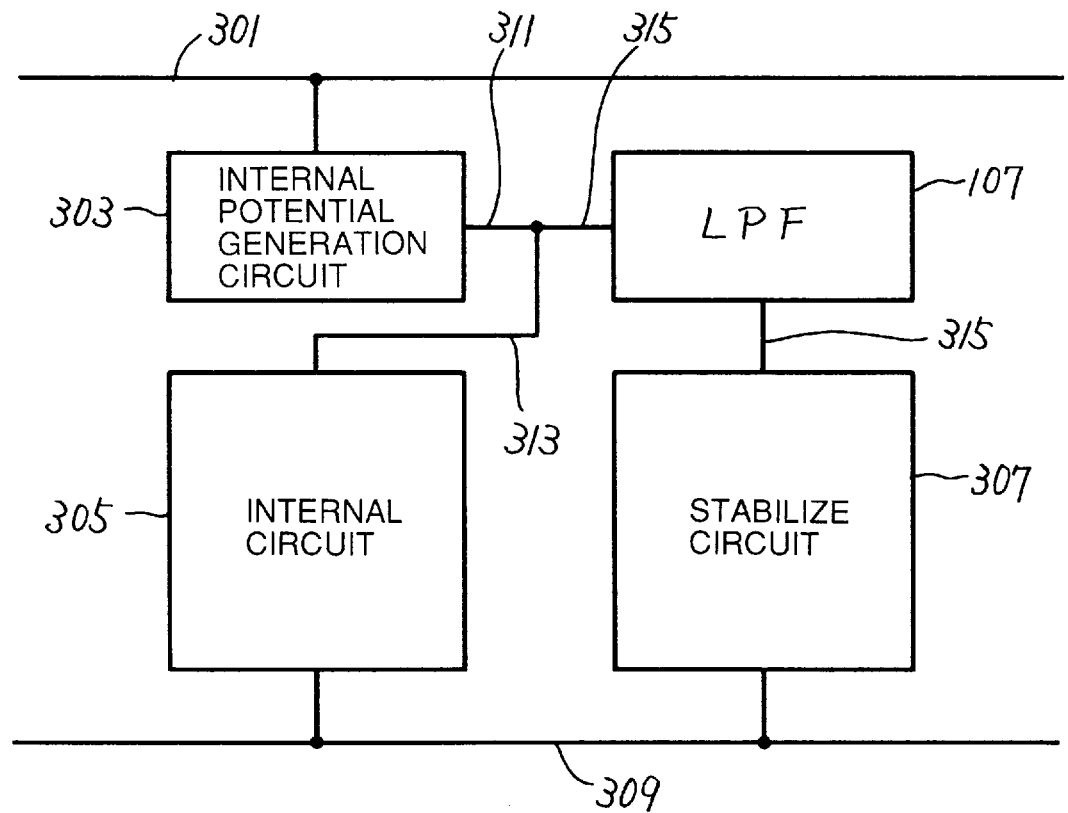
FIG. 11 is a schematic block diagram showing a semiconductor device according to a fourth embodiment of the present invention.

FIG. 11 is a schematic block diagram showing a semiconductor device according to a fourth embodiment of the present invention.

Referring to FIG. 11, the semiconductor device according to the fourth embodiment of the present invention includes an internal potential generation circuit 303, an internal circuit 305, lowpass filter (LPF) 107, a stabilize circuit 307, an external power supply line 301, an internal GND line 309, and first, second and third internal potential lines 311, 313 and 315.

In the second embodiment, a filter is disposed for externally applied power supply potential, signal, and the like and the output of the filter is transmitted to the next circuit. In the present embodiment, on the other hand, internal power supply potential and internal signal generated inside are transmitted through a filter to the next circuit.

Referring to FIG. 11, internal potential generation circuit 303 includes an internal power supply potential reduction circuit (VDC), a substrate bias circuit, a ½ Vcc generation circuit, and a boosted potential generation circuit. A boosted potential generated by the boosted potential generation circuit is provided as a potential in activating a word line which is not shown. In addition, it may be provided to an analog circuit requiring a high potential level.

In the present embodiment, description will be made assuming a boosted potential generation circuit is used as internal potential generation circuit 303. In this case, internal circuit 305 is a word line activation circuit for activating a word line, and stabilize circuit 307 is an analog circuit requiring a high potential level.

The boosted potential generation circuit as internal potential generation circuit 303 receives an external power supply potential from external power supply line 301. A ground potential is applied from internal GND line 309 to the word line activation circuit as internal circuit 305 and to the analog circuit as stabilize circuit 307.

The boosted potential generated by the boosted potential generation circuit as internal potential generation circuit 303 is provided to the word line activation circuit as internal circuit 305 through first and second internal potential lines 311 and 313. The boosted potential generated by the boosted potential generation circuit as internal potential generation circuit 307 is provided to the analog circuit as stabilize circuit 303 through first and third internal potential lines 311 and 315. It should be noted that the boosted potential is applied through lowpass filter 107 provided at the third internal potential line to the analog circuit as stabilize circuit 307.

Upon activation of a word line, a large current flows to the word line from the boosted potential level, whereby the boosted potential level generates noise. In general, such noise affects the analog circuit (stabilize circuit 307) requiring a higher potential level, thereby possibly causing malfunction. Therefore, in the present embodiment, lowpass filter 107 is provided at third internal potential line 315 for providing the boosted potential to the analog circuit as stabilize circuit 307, thereby reducing noise propagating to stabilize circuit 307 by lowpass filter 107.

As described above, in the semiconductor device according to the fourth embodiment of the present invention, lowpass filter 107 is provided at the internal potential line (third internal potential line 315) for providing the internal potential (boosted potential) generated from internal potential generation circuit 303 to stabilize circuit 307 susceptible to noise. As a result, reduced amount of noise generated by operation of internal circuit 305 is propagated to stabilize circuit 307 through the internal potential lines (first, second and third internal potential lines 311, 313 and 315).

Embodiment 5

Figure 12:
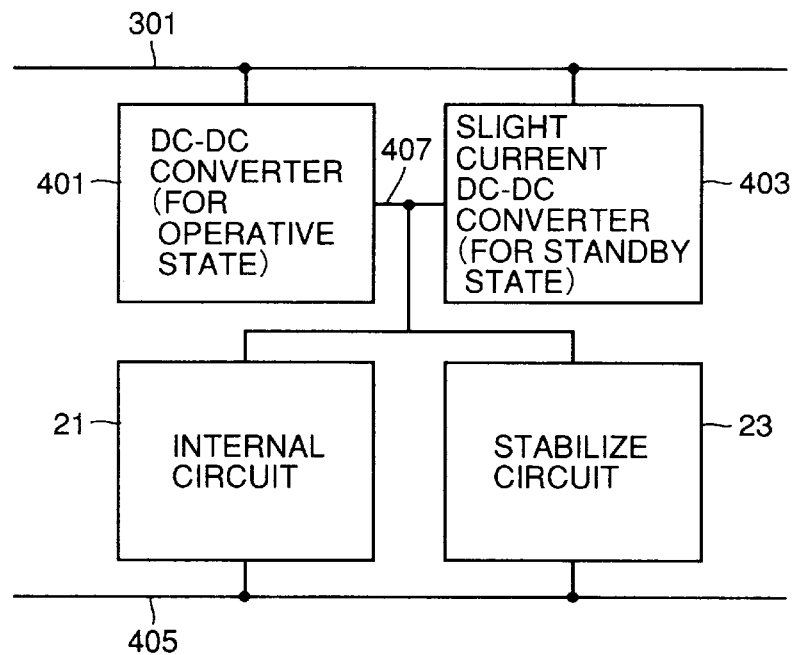
FIG. 12 is a schematic block diagram showing a general semiconductor device.

FIG. 12 is a schematic block diagram showing a general semiconductor device.

Referring to FIG. 12, the general semiconductor device includes a DC-DC converter 401, a DC-DC converter 403 for a slight current, internal circuit 21, stabilize circuit 23, external power supply line 301, an external GND line 405, and an internal power supply line 407.

DC-DC converter 401 and slight current DC-DC converter 403 reduce an external power supply potential provided from external power supply line 301, and operate internal circuit 21 and stabilize circuit 23 at a lower power supply potential (hereinafter referred to as an "internal power supply potential") than the external power supply potential. The internal power supply potential is applied to internal circuit 21 and stabilize circuit 23 through internal power supply line 407.

DC-DC converter 401 carries out potential reduction when the semiconductor device is in an operative state. Slight current DC-DC converter 403 carries out potential reduction when the semiconductor device is in an operative state or in a standby state. In a standby state of the semiconductor device, DC-DC converter 401 is in an inactivated state to suppress consumption of current.

Internal circuit 21 generates noise during operation. Stabilize circuit 23 is susceptible to noise. Internal circuit 21 and stabilize circuit 23 receive a ground potential from the external GND line.

As shown in FIG. 12, in the general semiconductor device, a power supply potential is provided to internal circuit 21 and stabilize circuit 23 through one internal power supply line 407. As a result, noise accompanied with operation of internal circuit 21 is conveyed to stabilize circuit 23 through internal power supply line 407 during operation of the internal circuit 21, thereby causing malfunction of stabilize circuit 23. The present embodiment solves such problems.

Figure 13:
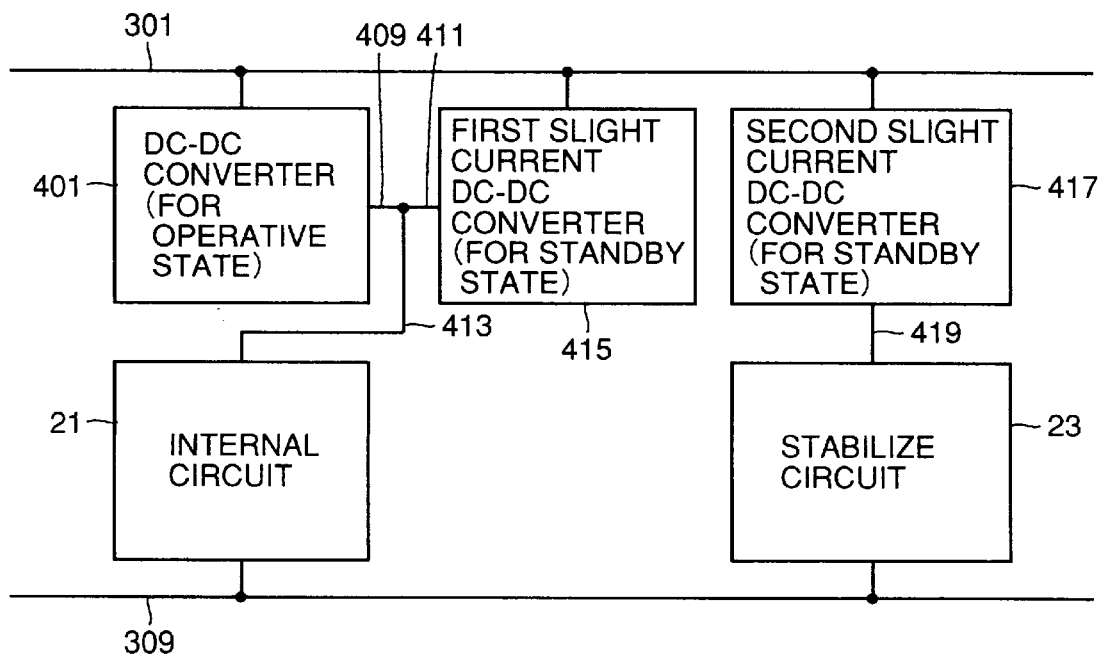
FIGS. 13–16 are schematic block diagrams showing semiconductor devices according to fifth through eighth embodiments of the present invention, respectively.

FIG. 13 is a schematic block diagram showing a semiconductor device according to a fifth embodiment of the present invention.

Referring to FIG. 13, the semiconductor device according to the fifth embodiment of the present invention includes DC-DC converter 401, first and second slight current DC-DC converters 415 and 417, internal circuit 21, stabilize circuit 23, external power supply line 301, internal GND line 309, and first, second, third and fourth internal power supply lines 409, 411, 413 and 419. The portions identical to those in FIG. 12 are indicated by the identical reference numerals and description thereof will not be repeated.

Referring to FIG. 13, first slight current DC-DC converter 415 provides internal circuits 21 with a power supply potential (hereinafter referred to as a "first internal power supply potential") obtained by reducing the external power supply potential provided from external power supply line 301 when the semiconductor device is in operative or standby state. The first internal power supply potential generated from converter 415 is applied to internal circuit 21 through second and third internal power supply lines 411 and 413. A power supply potential (hereinafter referred to as a "second internal power supply potential") generated from DC-DC converter 401 is provided to internal circuit 21 through first and third internal power supply lines 409 and 413 during operation of the semiconductor device.

Second slight current DC-DC converter 417 generates a power supply potential (hereinafter referred to as a "third internal power supply potential") obtained by reducing the external power supply potential provided from external power supply line 301. The third internal power supply potential generated from second slight current DC-DC converter 417 is applied to stabilize circuit 23 through fourth internal power supply line 419.

Internal GND line 309 provides the ground potential to internal circuit 21 and stabilize circuit 23.

As described above, in the semiconductor device according to the fifth embodiment of the present invention, the internal power supply lines (first, second and third internal power supply lines 409, 411, and 413) for providing internal circuit 21 with the internal power supply potentials (the first and second internal power supply potentials) are disposed separately from the internal power supply line (fourth internal power supply line 419) for providing stabilize circuit 23 with the internal power supply potential (the third internal power supply potential).

Therefore, noise accompanied with operation of internal circuit 21 will not propagate directly to stabilize circuit 23. The noise caused by operation of internal circuit 21 and propagated through external power supply line 301 is absorbed by DC-DC converter 401, and first and second slight current DC-DC converters 411 and 417. More specifically, DC-DC converter 401 and first and second slight current DC-DC converters 411 and 417 function as a filter, thereby reducing the possibility of propagating noise to stabilize circuit 23.

Although DC-DC converter 401, slight current DC-DC converter 403, and first and second slight current DC-DC converters 415 and 417 are employed as circuits for generating the internal power supply potentials in the present embodiment, other circuits can be employed as long as such circuits generate an internal potential, including a boosted potential generation circuit, a substrate bias circuit, and a ½ Vcc generation circuit.

Embodiment 6

Figure 14:
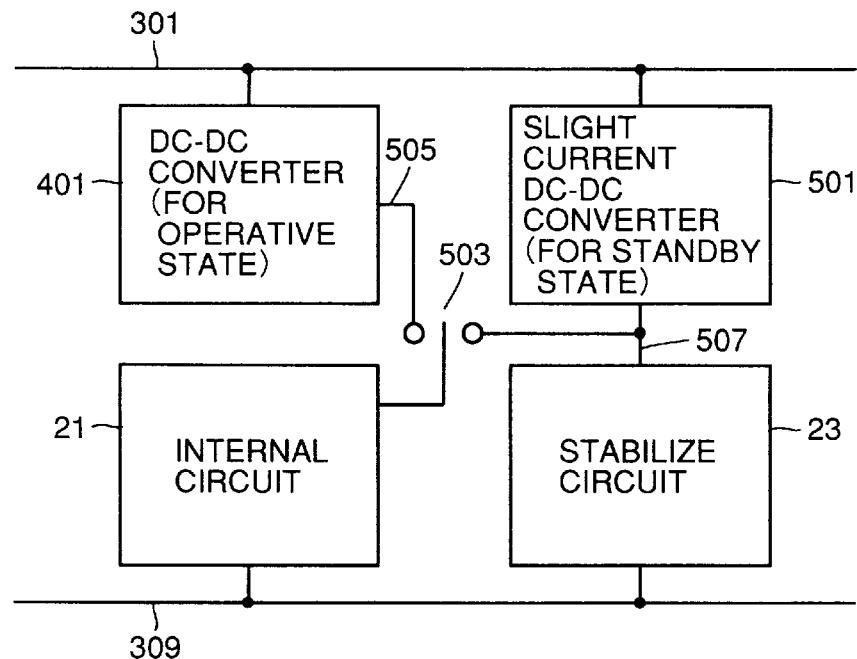

FIG. 14 is a schematic block diagram showing a semiconductor device according to a sixth embodiment of the present invention.

Referring to FIG. 14, the semiconductor device according to the sixth embodiment of the present invention includes DC-DC converter 401, internal circuit 21, a slight current DC-DC converter 501, stabilize circuit 23, external power supply line 301, a first internal power supply line 505, a switch 503, a second internal power supply line 507, and internal GND line 309. The portions identical to those in FIG. 12 are indicated by the identical reference numerals and description thereof will not be repeated.

Slight current DC-DC converter 501 reduces the external power supply potential provided from external power supply line 301 and generates the first internal power supply potential. Switch 503 is connected to first internal power supply line 505 when the semiconductor device is in an operative state. DC-DC converter 401 provides internal circuit 21 with the first internal power supply potential obtained by reducing the external power supply potential.

When the semiconductor device is in a standby state, switch 503 is connected to second internal power supply line 507. Internal circuit 21 and stabilize circuit 23 receive the second internal power supply potential obtained by reducing the external power supply potential generated from converter 501.

As described above, in the semiconductor device according to the sixth embodiment of the present invention, internal circuit 21 and second internal power supply line 507 are disconnected during operation of the semiconductor device, i.e. during operation of the internal circuit, so that noise accompanied with operation of internal circuit 21 will not propagate directly to stabilize circuit 23. Since internal circuit 21 and first internal power supply line 505 are connected during operation of the semiconductor device, noise may propagate to stabilize circuit 23 through external power supply line 301. In this case, however, DC-DC converter 401 and slight current DC-DC converter 501 function as a filter and absorb the noise, thereby reducing the possibility of propagating noise to stabilize circuit 23.

Although DC-DC converter 401 and slight current DC-DC converter 501 are employed as circuits for generating the internal power supply potentials in the present embodiment, other circuits can be employed as long as such circuits generate an internal potential, including a boosted potential generation circuit, a substrate bias circuit, and a ½ Vcc generation circuit.

Embodiment 7

Figure 15:
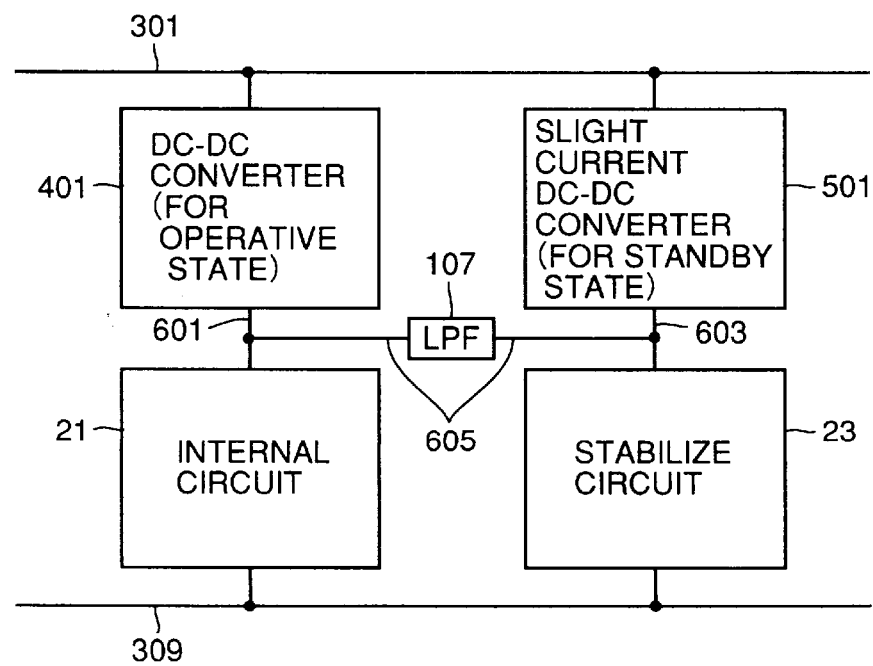

FIG. 15 is a schematic block diagram showing a semiconductor device according to a seventh embodiment of the present invention.

Referring to FIG. 15, the semiconductor device according to the seventh embodiment of the present invention includes DC-DC converter 401, slight current DC-DC converter 501, internal circuit 21, stabilize circuit 23, lowpass filter (LPF) 107, external power supply line 301, first, second and third internal power supply lines 601, 603 and 605, and internal GND line 309. The portions identical to those in FIG. 14 are indicated by the same reference numerals and description thereof will not be repeated.

Lowpass filter (LPF) 107 is similar to lowpass filter (LPF) 107 in the second embodiment. When the semiconductor device is in an operative state, the first internal power supply potential is provided from DC-DC converter 401 through first internal power supply line 601 to internal circuit 21. Stabilize circuit 23 receives the first internal power supply potential from DC-DC converter 401 through first, second and third internal power supply lines 601, 603 and 605. It should be noted that the first internal power supply potential is provided to stabilize circuit 23 through lowpass filter 107 provided at third internal power supply line 605.

Slight current DC-DC converter 501 provides the second internal power supply potential to stabilize circuit 23 through second internal power supply line 603. Slight current DC-DC converter 501 also provides the second internal power supply potential to internal circuit 21 through second, third, and first internal power supply lines 603, 605 and 601.

The second internal power supply potential provided from slight current DC-DC converter 501 is provided to internal circuit 21 through lowpass filter 107 provided at third internal power supply line 605. When the semiconductor device is in a standby state, DC-DC converter 401 attains an inactivated state.

Thus, in the semiconductor device according to the seventh embodiment of the present invention, lowpass filter 107 is provided at third internal power supply line 605. As a result, noise generated by operation of internal circuit 21 is absorbed by lowpass filter 107 in propagating through third internal power supply line 605, thereby reducing possibility of propagating noise to stabilize circuit 23.

Furthermore, in the present embodiment, noise propagating to stabilize circuit 23 is reduced not by switching operation of switch 503 as in the sixth embodiment shown in FIG. 14 but by lowpass filter 107 provided between internal circuit 21 and stabilize circuit 23, thereby eliminating need for considering noise generated by the switching operation of switch 503 as in the sixth embodiment shown in FIG. 14.

Although DC-DC converter 401 and slight current DC-DC converter 501 are employed as circuits for generating the internal power supply potentials in the present embodiment, other circuits can be utilized as long as they generate the internal potential, including a boosted potential generation circuit, a substrate bias circuit, and a ½ Vcc generation circuit.

Embodiment 8

Figure 16:
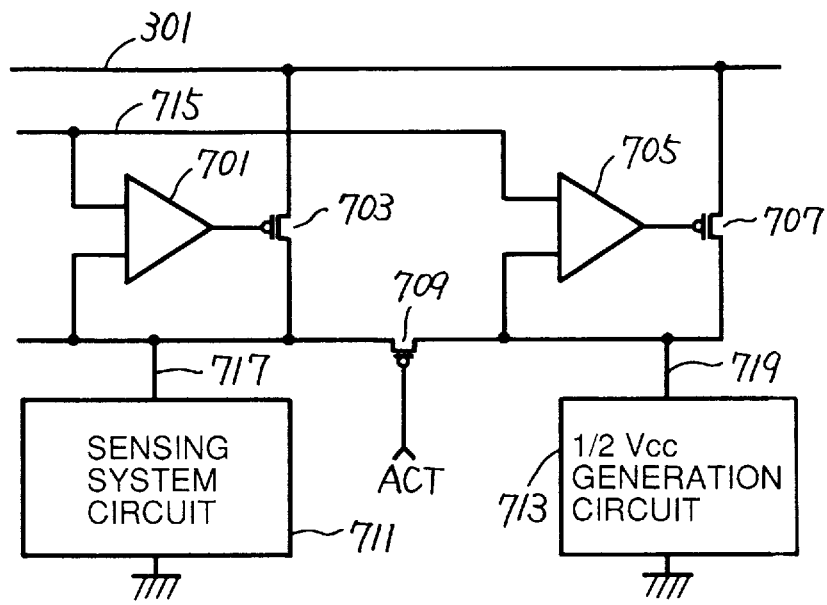

FIG. 16 is a schematic block diagram showing a semiconductor device according to an eighth embodiment of the present invention. Referring to FIG. 16, the semiconductor device according to the eighth embodiment of the present invention includes first and second comparators 701 and 705, PMOS transistors 703 and 707, a switch 709, a sensing system circuit 711, a ½ Vcc generation circuit 713, external power supply line 301, a reference potential provision line 715, and first and second internal power supply lines 717 and 719.

In the present embodiment, driving a memory cell array in a dynamic random access memory (hereinafter referred to as a "DRAM") is considered. Recently, in a DRAM, an internal power supply potential reduction circuit including a DC-DC converter using a comparator and a PMOS driver is employed to reduce an external power supply potential (external Vcc) to obtain the power supply potential in a chip lower than the external power supply potential with respect to a power supply potential in a chip.

Referring to FIG. 16, first comparator 701 compares a potential level of reference potential provision line 715 giving a reference and a potential level of first internal power supply line 717. Based on the result of comparison, turn on/off of PMOS transistor 703 is controlled, and the external power supply potential provided from external power supply line 301 is reduced. Here, first comparator 701 and PMOS transistor 703 form an internal power supply potential reduction circuit (VDC) for activation of a semiconductor device.

Second Comparator 705 compares a potential level provided from reference potential provision line 715 and giving a reference and a potential level of second internal power supply line 719. Based on the result of comparison, turn on/off of PMOS transistor 707 is controlled and the external power supply potential applied from external power supply line 301 is reduced. Second comparator 705 and PMOS transistor 707 form an internal power supply potential reduction circuit (VDC) for standby of a semiconductor device.

In FIG. 16, sensing system circuit 711 consuming a large current during an active period and ½ Vcc generation circuit 713 constantly consuming a slight current are employed as an example of the circuits utilizing the internal power supply potential obtained by reducing the external power supply potential with the internal power supply potential reduction circuit.

It should be noted that sensing system circuit 711 is a circuit for amplifying a slight change generated in the potential of a bit line by using initial charges transmitted to the bit line from a memory cell which is not shown. The ½ Vcc generation circuit 713 is a circuit for generating a potential for maintaining the bit line at an intermediate potential when the semiconductor device is in the standby state. The ½ Vcc generation circuit 713 mainly operates during the standby state of the semiconductor device and keeps consuming a current, though the amount is small.

First internal power supply line 717 connected to sensing system circuit 711 and second internal power supply line 719 connected to ½ Vcc generation circuit 713 are connected through switch 709. Switch 709 is a PMOS transistor having one electrode connected to first internal power supply line 717 and the other electrode connected to second internal power supply line 719. The PMOS transistor forming switch 709 receives at its control electrode an activation signal ACT of a semiconductor device.

Switch 709 makes connection by rendering activation signal ACT to "L" (Low) level when the semiconductor device is in the standby state. The active internal power supply potential reduction circuit formed by first comparator 701 and PMOS transistor 703 is inactivated in the standby mode. Therefore, sensing system circuit 711 and ½ Vcc generation circuit 713 receives the internal power supply potential generated from the standby internal power supply potential reduction circuit formed by second comparator 705 and PMOS transistor 707.

In the active state of the semiconductor device, switch 709 is turned off, thereby disconnecting first and second internal power supply lines 717 and 719. As a result, sensing system circuit 711 receives the internal power supply potential generated from the active internal power supply potential reduction circuit formed by first comparator 701 and PMOS transistor 703. On the other hand, ½ Vcc generation circuit 713 receives the internal power supply potential generated from the standby internal power supply potential reduction circuit formed by second comparator 705 and PMOS transistor 707.

As described above, in the semiconductor device according to the eighth embodiment of the present invention, first and second internal power supply lines 717 and 719 are disconnected by switch 709 during the active state of the semiconductor device. As a result, noise accompanied with operation of sensing system circuit 711 is less likely to propagate to ½ Vcc generation circuit 713.

Next, description will be made of another application of the present embodiment. When the semiconductor device is in a high speed mode (when sensing system circuit 711 generates a great amount of noise), switch 709 is turned off, disconnecting first and second internal power supply lines 717 and 719. Sensing system circuit 711 then receives the internal power supply potential generated from an internal power supply potential reduction circuit for a high speed mode formed by first comparator 701 and PMOS transistor 703. The ½ Vcc generation circuit 713 receives the internal power supply potential generated from an internal power supply potential reduction circuit for a normal mode formed by second comparator 705 and PMOS transistor 707.

When the semiconductor device is in a normal mode (when sensing system circuit 711 generates a small amount of noise), switch 709 is turned on, thereby connecting first and second internal power supply lines 717 and 719. Sensing system circuit 711 and ½ Vcc generation circuit 713 then receive the internal power supply potential generated from the internal power supply potential reduction circuit formed by first comparator 701 and PMOS transistor 703, and the internal power supply potential generated from the internal power supply potential reduction circuit formed by second comparator 705 and PMOS transistor 707.

Thus, in the eighth embodiment of the present invention, first and second internal power supply lines 717 and 719 are disconnected in a high speed mode in which sensing system circuit 711 generates a great amount of noise. Consequently, noise caused by sensing system circuit 711 is less likely to propagate to ½ Vcc generation circuit 713.

Figure 17:
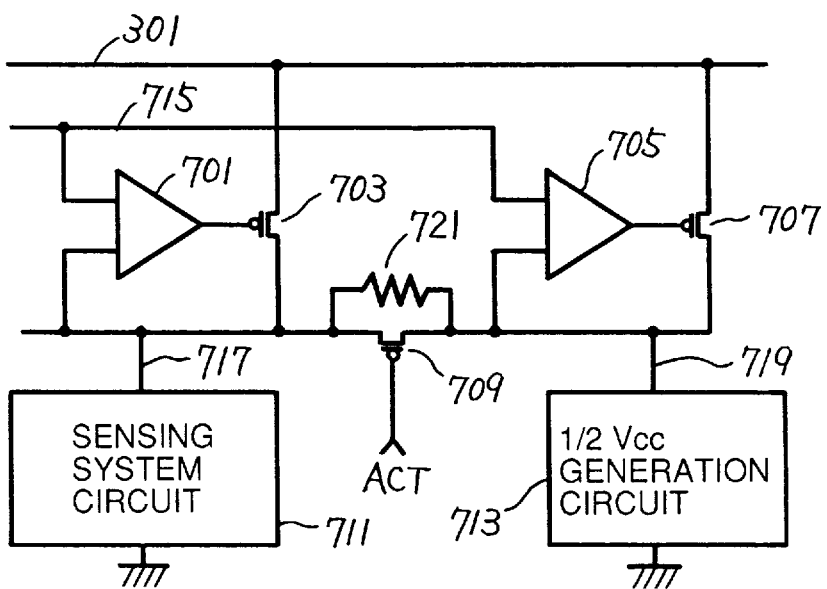
FIG. 17 is a schematic block diagram showing a modification of the semiconductor device according to the eighth embodiment of the present invention.

FIG. 17 is a schematic block diagram showing a modification of the semiconductor device according to the eighth embodiment of the present invention.

In the modification according to the eighth embodiment shown in FIG. 17, a resistor 721 is additionally provided to the structure of the eighth embodiment shown in FIG. 16. Therefore, the portions identical to those in FIG. 16 are indicated by the same reference numerals and description thereof will not be repeated.

Switch 709 is turned off when the semiconductor device is in an operative state or in a high speed mode. However, since resistor 721 is connected in parallel to switch 709, first and second internal power supply lines 717 and 719 are not completely disconnected. In this case, resistor 721 and parasitic capacitance thereof serve as a filter.

As described above, in the modification of the semiconductor device according to the eighth embodiment of the present invention, noise generated when sensing system circuit 711 is in an operative state or in a high speed mode is absorbed by resistor 721 and the parasitic capacitance thereof which serve as a filter in propagating to ½ Vcc generation circuit 713. Accordingly, noise propagating to ½ Vcc generation circuit 713 is reduced.

Figure 18:
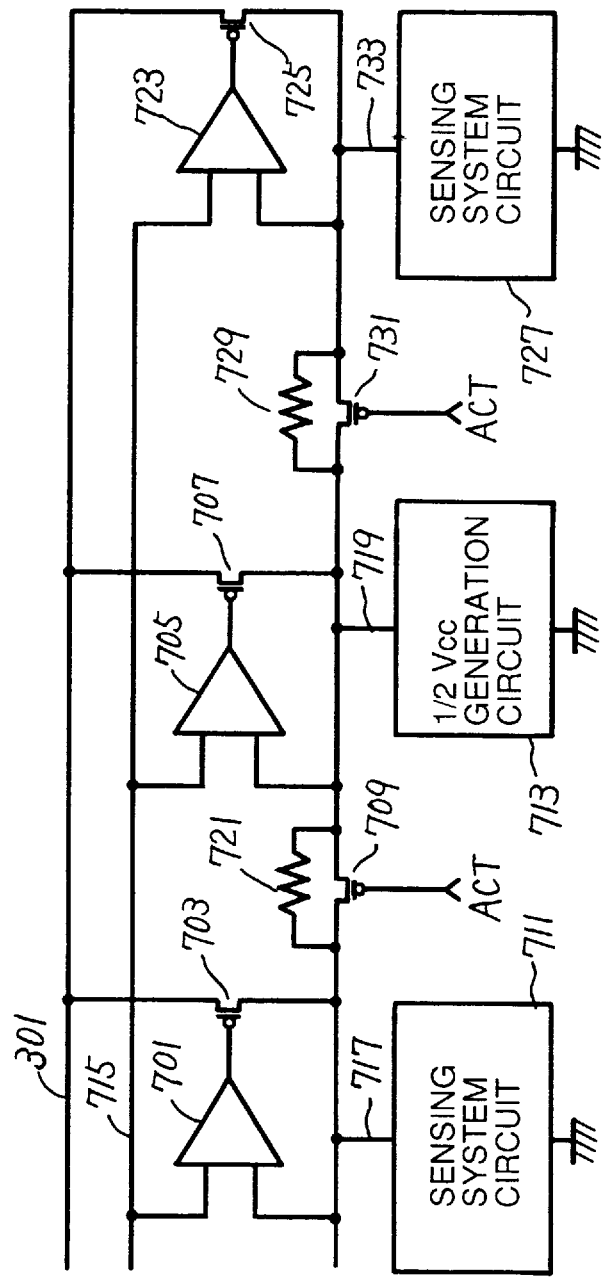
FIG. 18 is a schematic block diagram showing another modification of the semiconductor device according to the eighth embodiment of the present invention.

FIG. 18 is a schematic block diagram showing another modification of the semiconductor device according to the eighth embodiment of the present invention.

In the above-mentioned another modification of the eighth embodiment shown in FIG. 18, a resistor 729, a switch 731, a third comparator 723, a PMOS transistor 725, a third internal power supply line 733, and a sensing system circuit 727 are additionally provided to the structure of the modification according to the eighth embodiment shown in FIG. 17. Therefore, the portions identical to those in FIG. 17 are indicated by the same reference numeral and description thereof will not be repeated.

Third comparator 723 and PMOS transistor 725 form an internal power supply potential reduction circuit for activation of a semiconductor device.

Second comparator 723 compares a level of a reference potential applied from reference potential provision line 715 and a potential level of third internal power supply line 733. Based on the result of comparison, turn on/off of PMOS transistor 725 is controlled and the external power supply potential provided from external power supply line 301 is reduced to generate the internal power supply potential.

Switch 731 is turned on by rendering activation signal ACT of the semiconductor device applied to the control electrode thereof to an "L" level when the semiconductor device is in a standby state or in a normal mode, similarly to switch 709.

It is to be noted that the active internal power supply potential reduction circuit formed by third comparator 723 and PMOS transistor 725 is inactivated in this case.

More specifically, when the semiconductor device is in a standby state or in a normal mode, switches 709 and 731 are turned on, thereby connecting first and second internal power supply lines 717 and 719, and second and third internal power supply lines 719 and 733.

The internal power supply potential reduction circuit formed by first comparator 701 and MOS transistor 703, and the internal power supply potential reduction circuit formed by third comparator 723 and PMOS transistor 725 are in an inactivated state. As a result, sensing system circuits 711 and 727 and ½ Vcc generation circuit 713 receive the internal power supply potential generated from the internal power supply potential reduction circuit formed by second comparator 705 and PMOS transistor 707. Here, sensing system circuit 727 is similar to sensing system circuit 711.

When the semiconductor device is in an operative state or in a high speed mode, switches 709 and 731 are turned off. However, since resistors 721 and 729 are connected in parallel to switches 709 and 731 respectively, first and second internal power supply lines 717 and 719, and second and third internal power supply lines 719 and 733 are not completely disconnected. Therefore, resistor 721 and the parasitic capacitance thereof, and resistor 729 and the parasitic capacitance thereof serve as filters.

Consequently, when the semiconductor device is in an operative state or in a high speed mode, noise generated from sensing system circuit 711 is absorbed by the filter formed by resistor 721 and parasitic capacitance thereof in propagating to ½ Vcc generation circuit 713. Noise generated from sensing system circuit 727 is absorbed by the filter formed by resistor 729 and the parasitic capacitance thereof in propagating to ½ Vcc generation circuit 713.

As described above, in the above another modification of the eighth embodiment of the present invention, when the semiconductor device is in an operative state or in a high speed mode, switches 709 and 731 are turned off, so that resistors 721 and 729 and the parasitic capacitance thereof serve as filters, thereby reducing noise propagating to ½ Vcc generation circuit 713.

Furthermore, when the semiconductor device is in a standby state or in a normal mode, both switches 709 and 731 are turned on, so that sensing system circuits 711 and 727 can share the standby or normal mode internal power supply potential reduction circuit formed by second comparator 705 and PMOS transistor 707.

Accordingly, consumed current can be reduced during the standby period or in the normal mode of the semiconductor device as compared to the case where the standby or normal mode internal power supply potential reduction circuit is provided for each of sensing system circuits 711 and 727.

It is to be noted that effects of noise given to ½ Vcc generation circuit 713 can be diminished by removing resistors 721 and 729. When the semiconductor device is in a standby state or in a normal mode, sensing system circuits 711 and 727 can share the standby or normal mode internal power supply potential reduction circuit, thereby reducing consumed current during a standby period or in a normal mode of the semiconductor device.

Embodiment 9

The present embodiment relates to a case where a memory cell array of a DRAM is driven.

Figure 19:
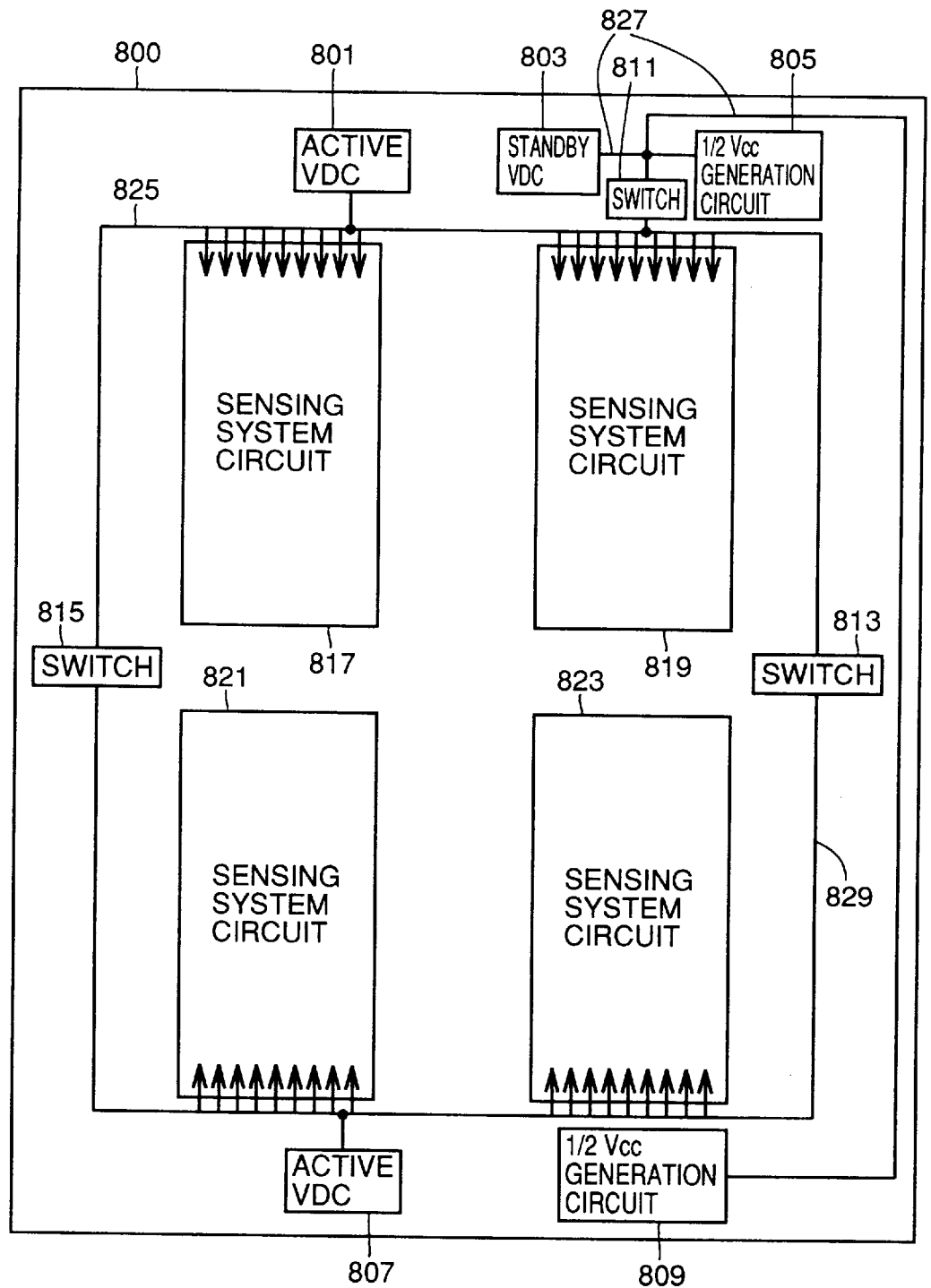
FIGS. 19–21 are schematic block diagrams showing semiconductor devices according to ninth through eleventh embodiments of the present invention.

FIG. 19 is a schematic block diagram showing a semiconductor device according to a ninth embodiment of the present invention.

Referring to FIG. 19, a semiconductor device 800 according to the ninth embodiment of the present invention includes internal power supply potential reduction circuits (VDC) for activation 801 and 807, an internal power supply potential reduction circuit (VDC) for standby 803, ½ Vcc generation circuits 805 and 809, switches 811, 815 and 813, sensing system circuits 817, 819, 821 and 823, and first, second and third internal power supply lines 825, 827 and 829.

Sensing system circuits 817, 819, 821 and 823 are similar to sensing circuit 711 shown in FIG. 16. Active VDCs 801 and 807 are similar to the active internal power supply potential reduction circuit formed by first comparator 701 and PMOS transistor 703 shown in FIG. 16. Standby VDC 803 is similar to the standby internal power supply potential reduction circuit formed by second comparator 705 and PMOS transistor 707 shown in FIG. 16. The ½ Vcc generation circuits 805 and 809 are similar to ½ Vcc generation circuit 713 shown in FIG. 16. Switches 811, 815 and 813 are similar to switch 709 shown in FIG. 16. In this case, resistors can be connected in parallel to both ends of switches 811, 815 and 813.

When the semiconductor device is in an operative state, switches 811, 815 and 813 are turned off. As a result, first and second internal power supply lines 825 and 827 are disconnected. First and third internal power supply lines 825 and 829 are also disconnected. Thus, sensing system circuits 817 and 819 receive the internal power supply potential from active VDC 801. Sensing system circuits 821 and 823 receive the internal power supply potential from active VDC 807.

When the semiconductor device is in a standby state, switches 811, 815 and 813 are turned on. As a result, first and second internal power supply lines 825 and 827 are connected, and first and third internal power supply lines 825 and 829 are connected. Since active VDCs 801 and 807 attain an inactivated state, sensing system circuits 817, 819, 821 and 823 and ½ Vcc generation circuits 805 and 809 receive the internal power supply potential from standby VDC 803. When the semiconductor device is in an operative state, standby VDC 803 applies the internal power supply potential to ½ Vcc generation circuits 805 and 809.

As described above, in the semiconductor device according to the ninth embodiment of the present invention, switches 811, 815 and 813 are turned off when the semiconductor device is in an operative state. As a result, noise generated from sensing system circuits 817, 819, 821 and 823 are less likely to propagate to ½ Vcc generation circuits 805 and 809 during operation of the semiconductor device.

When the semiconductor device is in a standby state, sensing system circuits 817, 819, 821 and 823 can share standby VDC 803. Therefore, consumed current during the standby period can be suppressed as compared to the case where a standby VDC is provided for each of sensing system circuits 817, 819, 821 and 823.

First and third internal power supply lines 825 and 829 can be connected without switches 815 and 813. In such a case as well, the similar effects to those with the semiconductor device in FIG. 19 can be obtained.

As described in the eighth embodiment, the present embodiment can also be applied when semiconductor device 800 is in a high speed mode or in a normal mode.

Embodiment 10

Figure 20:
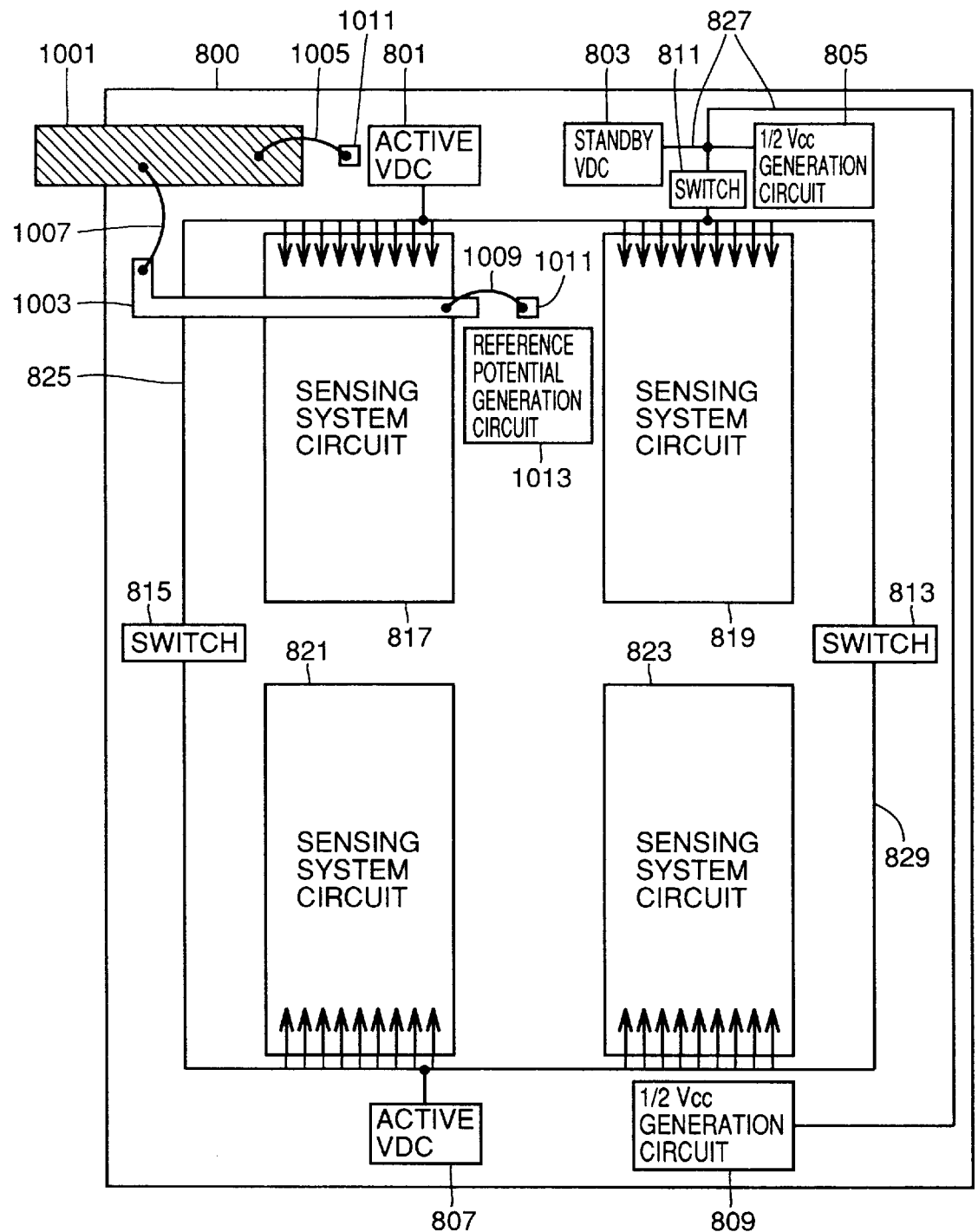

FIG. 20 is a schematic block diagram showing a semiconductor device according to a tenth embodiment of the present invention.

Referring to FIG. 20, the semiconductor device according to the tenth embodiment of the present invention includes an external lead 1001, an internal lead 1003, a reference potential generation circuit 1013, wires 1005, 1007, and 1009, and a pad 1011 additionally provided to the structure of the semiconductor device according to the ninth embodiment shown in FIG. 19. Therefore, the portions identical to those in FIG. 19 are indicated by the same reference numerals and description thereof will not be repeated.

In FIG. 20, a power supply potential is externally applied from external lead 1001 for a power supply through wire 1005 and pad 1011 to active VDC 801. Other external leads related to a power supply or a control signal are not shown in FIG. 20 for the sake of simplicity.

Referring to FIG. 20, if the power supply potential is applied to a circuit which performs analog operations and for which noise should be avoided, such as reference potential generation circuit 1013, by employing the same power supply line as that for active VDC 801 connected to normal circuits including sensing system circuits 817, 819, 821 and 823, then noise caused by operation of normal circuits including sensing system circuits 817, 819, 821 and 823 is undesirably transmitted to reference potential generation circuit 1013 (the circuit which performs analog operations and for which noise should be avoided), thereby possibly causing malfunction of circuit 1013. An example of such a case includes application of the power supply potential to reference potential generation circuit 1013 through the wire from external lead 1001 directly.

Therefore, in the present embodiment, internal lead 1003, different from external lead 1001, is employed so that reference potential generation circuit 1013 (circuit performing analog operations) receives the external power supply potential through internal lead 1003. Normal leads such as external lead 1001 extend outside the package to provide and receive a voltage to and from the outside. Internal lead 1003, however, does not extend outside the package. Internal lead 1003 is characterized in that it does not have a portion connecting outside for transmitting a signal or a power supply potential to the inside, though the cross section at the cut-down portion of a support member in the mold may be exposed to the outside of the package.

External lead 1001 and internal lead 1003 are connected by wire 1007. Internal lead 1003 is connected with reference potential generation circuit 1013 by wire 1009. Therefore, the power supply potential is conveyed from external lead 1001 through wire 1007, internal lead 1003 and wire 1009 to reference potential generation circuit 1013.

It should be noted that noise accompanied with operation of sensing circuits 817 and 819 is transmitted through active VDC 801, pad 1011 and wire 1005 to external lead 1001. The noise must go through two wires 1007 and 1009 before reaching reference potential generation circuit 1013. Since the inductance component (L component) and the capacitance component (C component) are present at wires 1007 and 1009 and these components function as filters, thereby attenuating noise at these portions.

The power supply potential is provided from external lead 1001, which is a normal lead, through wire 1005 to active VDC 801. In the present embodiment, a lead different from a normal lead such as external lead 1001, i.e. internal lead 1003 is provided and the power supply potential is applied through two wires 1007 and 1009 and internal lead 1003 to reference potential generation circuit 1013, an internal circuit.

As described above, in the semiconductor device according to the tenth embodiment of the present invention, internal lead 1003, a lead different from a normal lead such as external lead 1001, is provided and the power supply potential is applied through a plurality of wires 1007 and 1009 and internal lead 1003 to reference potential generation circuit 1013 susceptible to noise.

As a result, after reaching external lead 1001, noise accompanied with sensing system circuits 817, 819, 821 and 823 is conveyed through a plurality of paths to reference potential generation circuit 1013 susceptible to noise, during which time noise is decreased. In addition, wires 1007 and 1009 serve as filters, thereby attenuating noise before reaching reference potential generation circuit 1013 susceptible to noise. The present embodiment gives similar effects to those in the ninth embodiment.

Although the description has been made of how the power supply potential is applied from the outside in the present embodiment, the present embodiment can also be applied for a ground potential or a normal control signal. Although the power supply potential is provided through two wires 1007 and 1009 and one internal lead 1003 from external lead 1001 in the present embodiment, the power supply potential may be applied through more internal frames or wires to an internal circuit easily affected by noise such as a reference potential generation circuit. In addition, an interconnection for a package can replace internal lead 1003.

Embodiment 11

Figure 21:
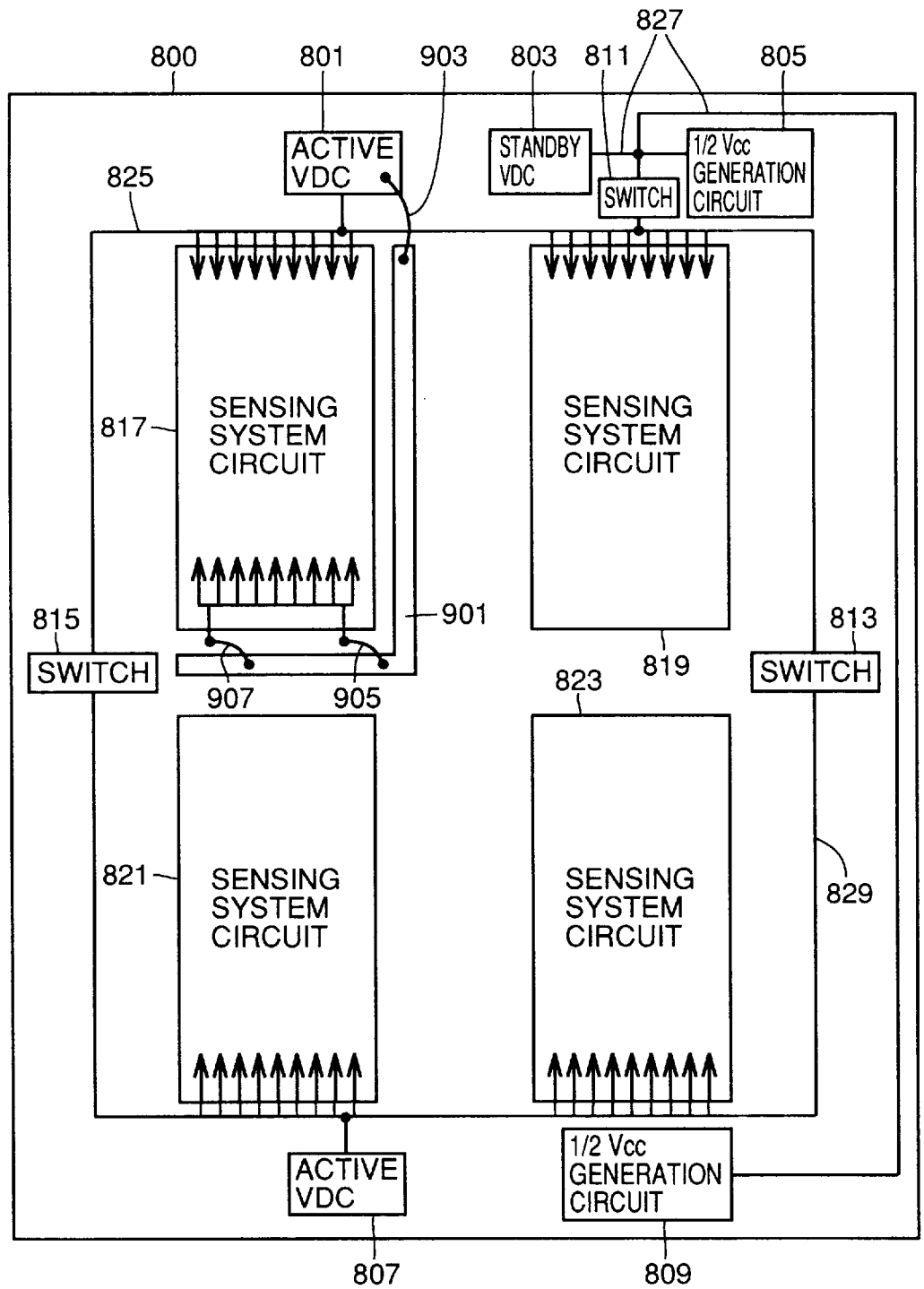

FIG. 21 is a schematic block diagram showing a semiconductor device according to an eleventh embodiment of the present invention.

Referring to FIG. 21, the semiconductor device according to the eleventh embodiment of the present invention includes an internal lead 901 and wires 903, 905 and 907 additionally provided to the structure of the semiconductor device according to the ninth embodiment shown in FIG. 19. Therefore, the portions identical to those in FIG. 19 are indicated by the same reference numerals and description thereof will not be repeated.

A lead for applying an external signal is not shown in FIG. 21. In general, the internal power supply potential generated in the internal potential generation circuit such as an internal power supply potential reduction circuit (VDC) is applied through an aluminum interconnection to a circuit in the semiconductor device. However, if such application is carried out only through an aluminum interconnection, resistance becomes greater, leading to a higher power supply impedance at an end remote from the source of the internal power supply potential, and therefore normal operation of a circuit receiving the internal power supply potential may not be expected.

Therefore, in the present embodiment, the internal power supply potential generated by active VDC 801 is applied through wire 903 to internal lead 901, as shown in FIG. 21. The power supply potential is provided from internal lead 901 to sensing system circuit 817 through wires 907 and 905. Internal lead 901 is similar to internal lead 1003 shown in FIG. 20. Internal lead 901 is thicker and has a smaller resistance than an aluminum interconnection.

As described above, in the eleventh embodiment of the present invention, the internal power supply potential is provided to sensing system circuit 817 through internal lead 901 having a smaller resistance than an aluminum interconnection. As a result, even if the internal power supply potential is to be applied to a circuit remote from active VDC 801 for generating the internal power supply potential, the potential drop is reduced and the circuit receiving the internal power supply potential can operate normally. The present invention achieves the effects similar to the ninth embodiment.

Figure 22:
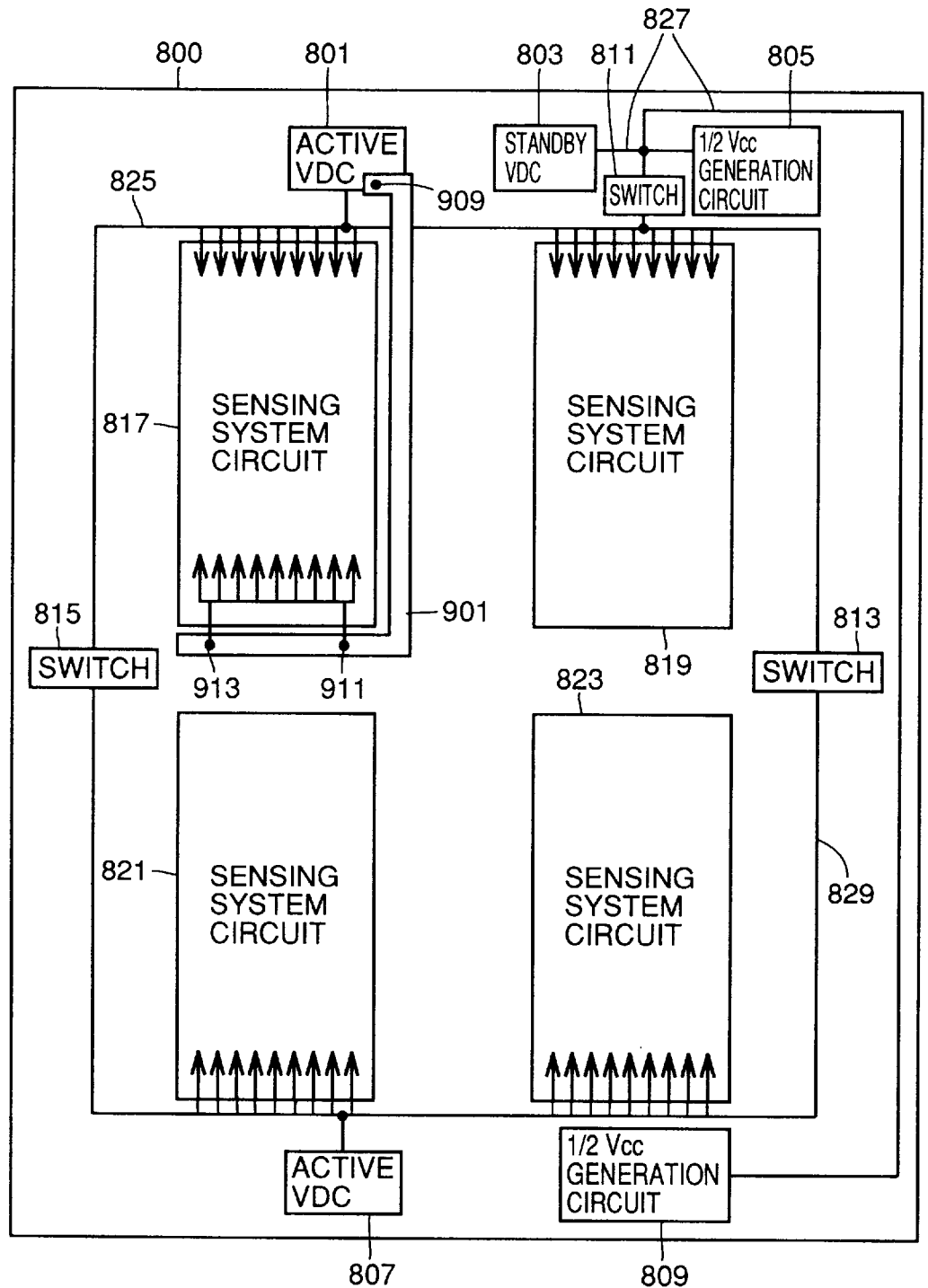
FIG. 22 is a schematic block diagram showing a modification of the semiconductor device according to the eleventh embodiment of the present invention.

FIG. 22 is a schematic block diagram showing a modification of the semiconductor device according to the eleventh embodiment of the present invention.

Referring to FIG. 22, the difference between the modification and the device in FIG. 21 lies in connection means between active VDC 801 and internal lead 901 and connection means between sensing system circuit 817 and internal lead 901. More specifically, while VDC 801 and internal lead 901 are connected by wire 903 in FIG. 21, they are connected by an interconnect 909 in FIG. 22. In addition, internal lead 901 and sensing system circuit 817 are connected by wires 905 and 907 in FIG. 21, while they are connected by interconnects 911 and 913 in FIG. 22. The portions identical to those in FIG. 21 are indicated by the same reference numerals and description thereof will not be repeated.

The internal power supply potential generated from active VDC 801 is provided to internal lead 901 through interconnect 909. The internal power supply potential provided to internal lead 901 is applied to sensing system circuit 817 through interconnects 911 and 913. Although not shown, internal lead 901 is connected to a pad on a chip by a bump, which is made of a conductive material including solder. Interconnects 909, 911 and 913 connect upper and lower layers and are formed of aluminum material.

As described above, in the modification of the eleventh embodiment of the present invention, the internal power supply potential generated by active VDC 801 is provided to an end portion of sensing system circuit 817 through internal lead 901 having a smaller resistance than an aluminum interconnection. As a result, at an end of sensing system circuit 817 remote from active VDC 801, potential drop of the internal power supply potential can be reduced and malfunction of sensing system circuit 817 can be prevented. The present embodiment achieves the similar effects to the ninth embodiment.

Although connection between active VDC 801 and internal lead 901 and connection between sensing system circuit 817 and internal lead 901 are made by interconnects 909, 911 and 913, they can be connected also by bumps.

Figure 23:
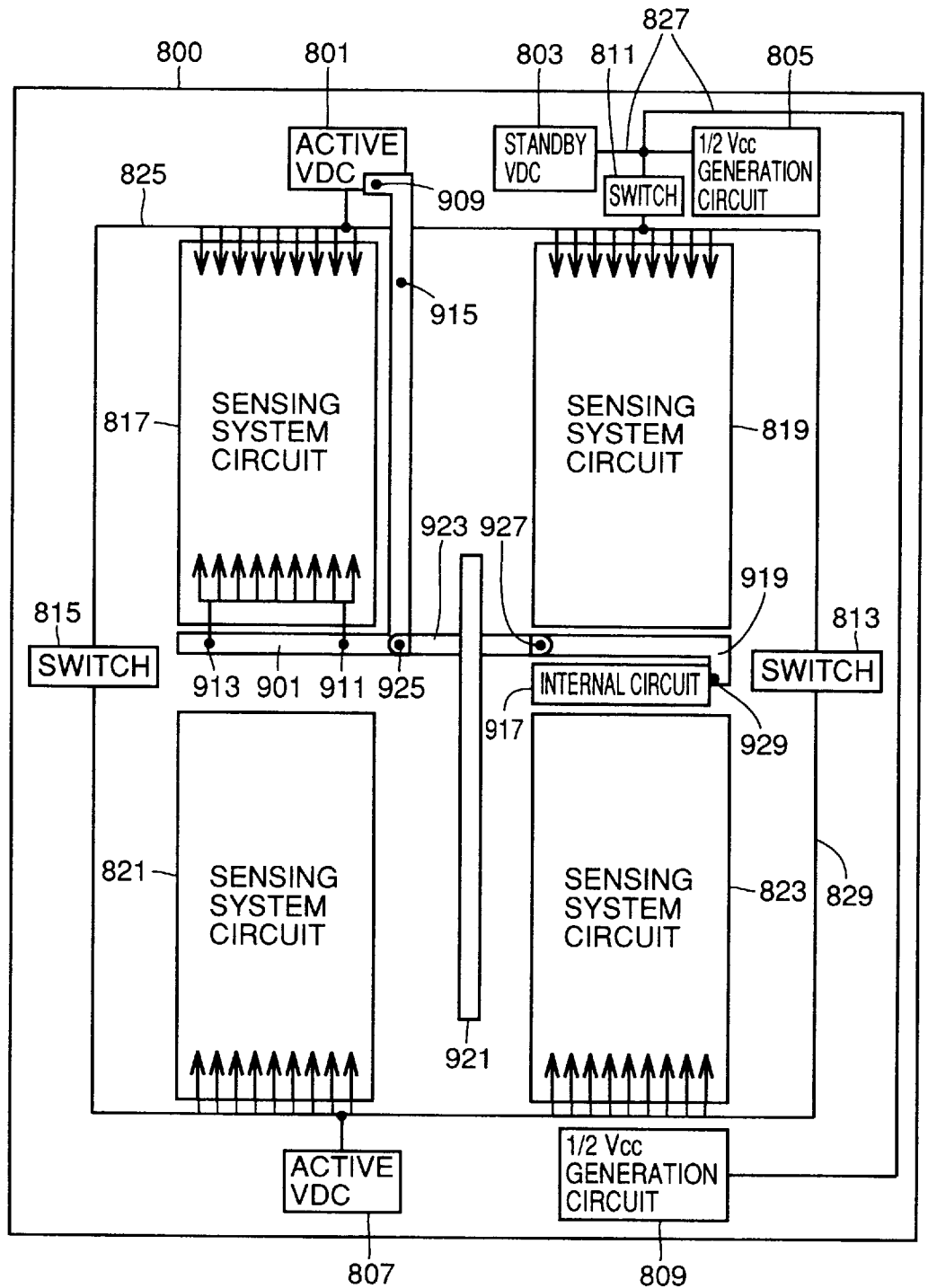
FIG. 23 is a schematic block diagram showing another modification of the semiconductor device according to the eleventh embodiment of the present invention.

FIG. 23 is a schematic diagram showing another modification of the semiconductor device according to the eleventh embodiment.

Referring to FIG. 23, in the above another modification of the eleventh embodiment, internal leads 901, 919 and 921, an aluminum interconnection 923, an internal circuit 917, interconnects 909, 913, 911, 925, 927 and 929, and a bump 915 are additionally provided to the structure of the ninth embodiment shown in FIG. 19. The portions identical to those in FIG. 19 are indicated by the same reference numerals and description thereof will not be repeated.

Internal lead 901 is connected to a pad on a chip by bump 915. Bump 915 is made of a conductive material including solder. Although not shown, the other internal leads 919 and 921 are also connected to pads on the chip by bumps.

Active VDC 801 and internal lead 901 a reconnected by interconnect 909. Internal lead 901 and sensing system circuit 817 are connected by interconnects 911 and 913. Internal lead 901 and aluminum interconnection 923 are connected by interconnect 925. Aluminum interconnection 923 and internal lead 919 are connected by interconnect 927.

Internal lead 919 and internal circuit 917 are connected by interconnect 929. It is to be noted that internal leads 901, 919 and 921 are provided in the same layer and internal leads 901 and 919 are connected by aluminum interconnection 923 provided in a different layer to avoid contact between internal lead 921 and internal leads 901 and 919.

The internal power supply potential generated from active VDC 801 is provided to internal lead 901 through interconnect 909. The internal power supply potential is further applied to sensing system circuit 817 through interconnects 911 and 913. The internal power supply potential is provided to internal lead 919 through interconnect 925, aluminum interconnection 923 and interconnect 927. The internal power supply potential is applied from internal lead 919 through interconnect 929 to internal circuit 917.

Here, internal leads 901, 919 and 921 are similar to internal lead 1003 shown in FIG. 20. Interconnects 909, 911, 913, 925, 927 and 929 connect upper and lower layers and similar to interconnects 909, 911 and 913 shown in FIG. 22.

As described above, in the above-mentioned another modification of the eleventh embodiment, the internal power supply potential generated by active VDC 801 is applied to sensing system circuit 817 and internal circuit 917 by employing internal leads 901 and 919 having a smaller resistance than an aluminum interconnection.

Consequently, even when the internal power supply potential is to be applied to internal circuit 917 and an end of sensing system circuit 817 remote from active VDC 801 serving as the source of the internal power supply potential, potential drop is small and malfunction of sensing system circuit 817 and internal circuit 917 can be prevented. The present embodiment gives the similar effects to the ninth embodiment.

Interconnections for a package can be used instead of internal leads 901, 919 and 921. Bumps can replace interconnects 909, 913, 911, 925, 927 and 929.

Embodiment 12

Figure 24:
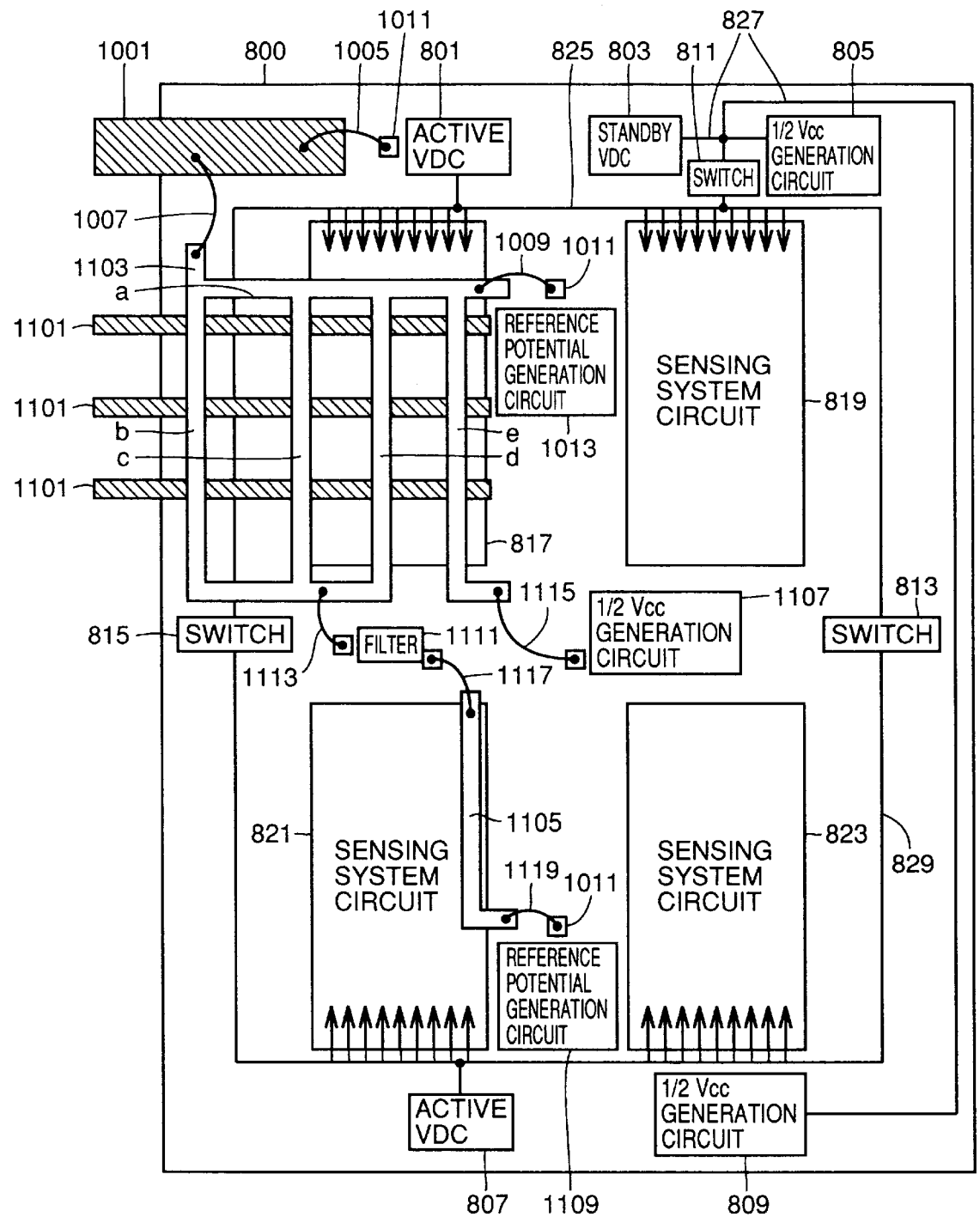
FIG. 24 is a schematic block diagram showing a semiconductor device according to a twelfth embodiment of the present invention.

FIG. 24 is a schematic block diagram showing a semiconductor device according to a twelfth embodiment of the present invention.

Referring to FIG. 24, the semiconductor device according to the twelfth embodiment includes external leads 1001 and 1101, internal leads 1103 and 1105, a ½ Vcc generation circuit 1107, reference potential generation circuits 1013 and 1109, a filter 1111, wires 1005, 1007, 1009, 1113, 1117, 1115, and 1119, and a pad 1011 additionally provided to the structure of the semiconductor device according to the ninth embodiment shown in FIG. 19. The portions identical to those in FIG. 19 are indicated by the same reference numerals and description thereof will not be repeated.

External lead 1101 is similar to external lead 1001 in FIG. 20. Internal leads 1103 and 1105 are similar to internal lead 1003 in FIG. 20. Reference potential generation circuits 1013 and 1109 are similar to reference potential generation circuit 1013 in FIG. 20. The ½ Vcc generation circuit 1107 is similar to ½ Vcc generation circuits 805 and 809. External lead 1101 is used for transmitting a control signal different from the external power supply potential applied to external lead 1001.

External lead 1001 and active VDC 801 are connected through wire 1005 and pad 1011. Internal lead 1103 and external lead 1001 are connected by wire 1007. Internal lead 1103 and reference potential generation circuit 1013 are connected through wire 1009 and pad 1011. Internal lead 1103 and filter 1111 are connected through wire 1113 and pad 1011. Filter 1111 and internal lead 1105 are connected through wire 1117 and pad 1011. Internal lead 1105 and reference potential generation circuit 1109 are connected through wire 1119 and pad 1011. Internal lead 1103 and ½ Vcc generation circuit 1107 are connected through wire 1115 and pad 1011.

In order that internal lead 1103 receiving the external power supply potential through wire 1007 from external lead 1001 can provide the potential to a desired circuit, including reference potential generation circuit 1013 and ½ Vcc generation circuit 1107, the potential must be conveyed over external lead 1101. In other words, external lead 1101 provided in the same layer as external lead 1001 is provided to overlap with internal lead 1103.

In such a case, an insulating film is inserted between internal lead 1103 and external lead 1101 to avoid malfunction by contact between external lead 1101 and internal lead 1103 at the overlapped portion. Alternatively, a space is provided between external lead 1101 and internal lead 1103 and insulating resin or the like is filled in the space to avoid contact therebetween. Thus, in the present embodiment, external lead 1101 and internal lead 1103 are provided in different layers with an insulating film interposed therebetween.

Internal lead 1103 is branched to a plurality of portions b, c, and d from portion a. Internal lead 1103 is formed as a frame, i.e. as a mesh.

The external power supply potential provided to external lead 1001 is applied to internal frame 1103 through wire 1007. The power supply potential is provided from internal frame 1103 to reference potential generation circuit 1013 through wire 1009 and pad 1011.

The power supply potential is further applied from internal lead 1103 to ½ Vcc generation circuit 1107 through wire 1115 and pad 1011. The power supply potential is applied from internal lead 1103 through wire 1113, filter 1111, pad 1011 and wire 1117 to internal lead 1105. The power supply potential is provided from internal lead 1105 to reference potential generation circuit 1109 through wire 1119 and pad 1011. Internal lead 1105 can be provided in the same layer as external lead 1101 or as internal lead 1103.

As described above, in the semiconductor device according to the twelfth embodiment of the present invention, external lead 1101 and internal lead 1103 are provided in different layers. As a result, the freedom in shape of external lead 1101 or internal lead 1103 is increased. Although external lead 1101 is provided in a lower layer and internal lead 1103 is in an upper layer in FIG. 24, they can be provided vice versa. External leads 1101 for receiving an external signal, themselves, can be provided in upper and lower layers. By thus providing external leads 1101 in upper and lower layers as desired, freedom in shape of external lead 1101 and internal lead 1103 can be enhanced.

In the twelfth embodiment of the present invention, the power supply potential is applied through internal leads 1103 and 1105 having a greater resistance than an aluminum interconnection to reference potential generation circuits 1013 and 1109 and ½ Vcc generation circuit 1107. Therefore, even if reference potential generation circuits 1013 and 1109 and ½ Vcc generation circuit 1107 are remote from external lead 1001 which is the source of the power supply potential, potential drop before reaching these circuits is small and malfunction of reference potential generation circuits 1013 and 1109 and ½ vcc generation circuit 1107 can be prevented.

Furthermore, in the twelfth embodiment of the present invention, the power supply potential is provided through wire 1007, internal lead 1103 and 1109 from external lead 1001 to reference potential generation circuit 1013. As a result, noise accompanied with operation of sensing system circuits 817 and 819 is reduced while passing through such a plurality of paths.

Since wires 1007 and 1009 function as filters including inductance component and capacitance component, noise propagating to reference potential generation circuit 1013 is reduced also by wires 1007 and 1009. The same applies to the noise propagating to ½ Vcc generation circuit 1107 and reference potential generation circuit 1109.

The power supply potential is applied through filter 1111 from external lead 1001 to reference potential generation circuit 1109. Consequently, filter 1111 absorbs noise, thereby reducing noise propagating to reference potential generation circuit 1109. The present embodiment achieves the similar effects to the ninth embodiment.

Figure 25:
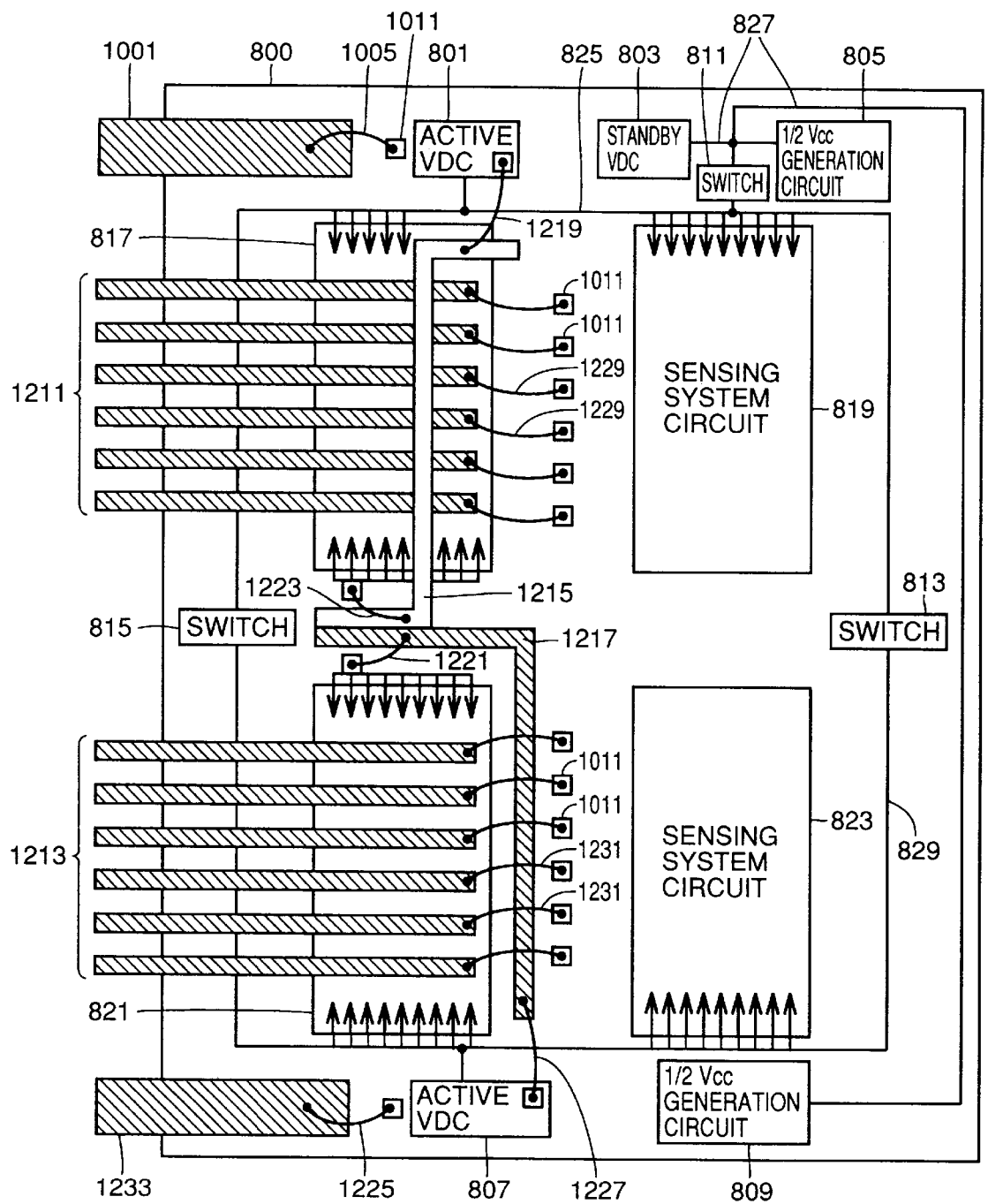
FIG. 25 is a schematic block diagram showing a modification of the semiconductor device according to the twelfth embodiment of the present invention.

FIG. 25 is a schematic block diagram showing a modification of the semiconductor device according to the twelfth embodiment of the present invention.

Referring to FIG. 25, the modification of the twelfth embodiment includes external leads 1001, 1211, 1213 and 1233, first and second internal leads 1215 and 1217, wires 1005, 1219, 1229, 1223, 1221, 1231, 1227 and 1225, and a pad 1011 provided additionally to the structure of the semiconductor device according to the ninth embodiment shown in FIG. 19. The portions identical to those in FIG. 19 are indicated by the same reference numerals and description thereof will not be repeated.

First and second internal leads 1215 and 1217 are similar to internal lead 1003 in FIG. 20. External leads 1001 and 1233 are similar to external lead 1001 in FIG. 20. External leads 1211 and 1213 are similar to external lead 1101 in FIG. 24.

Active VDC 801 and external lead 1001 are connected through wires 1005 and pad 1011. Active VDC 801 and first internal lead 1215 are connected through pad 1011 and wire 1219. First internal lead 1215 and sensing system circuit 817 are connected through wire 1223 and pad 1011. Each of the plurality of external leads 1211 are connected by wire 1229 to each of the plurality of pads 1011 on the chip.

External lead 1233 and active VDC 807 are connected by wire 1225 and pad 1011. Active VDC 807 and second internal lead 1217 are connected through wire 1227 and pad 1011. Second internal lead 1217 and sensing system circuit 821 are connected through wire 1221 and pad 1011. Each of the plurality of externals leads 1213 are connected by wire 1231 to each of the plurality of pads 1011 provided on the chip.

External lead 1211 and first internal lead 1215 are provided in different layers as described with respect to FIG. 24. Here, external leads 1001 and 1211 are provided in a first layer (lower layer) while first internal lead 1215 is provided in a second layer (upper layer). External leads 1213 and 1233 and second internal lead 1217 are provided in the first layer. As a result, wire 1231 connecting each of the plurality of external leads 1213 and each of the plurality of pads 1011 on the chip extends over second internal lead 1217.

The internal power supply potential generated at active VDC 801 is applied to sensing system circuit 817 through wire 1219 and first internal lead 1215. The internal power supply potential generated from active VDC 807 is provided to sensing system circuit 821 through wire 1227, second internal lead 1217 and wire 1221.

As described above, in the modification of the twelfth embodiment, a plurality of external leads 1211 and first internal lead 1215 are provided in different layers. Sensing system circuits 817 and 821 receive the internal power supply potential through first and second internal leads 1215 and 1217, respectively. As a result, the modification of the twelfth embodiment achieves the similar effects to the twelfth embodiment.

Figure 26:
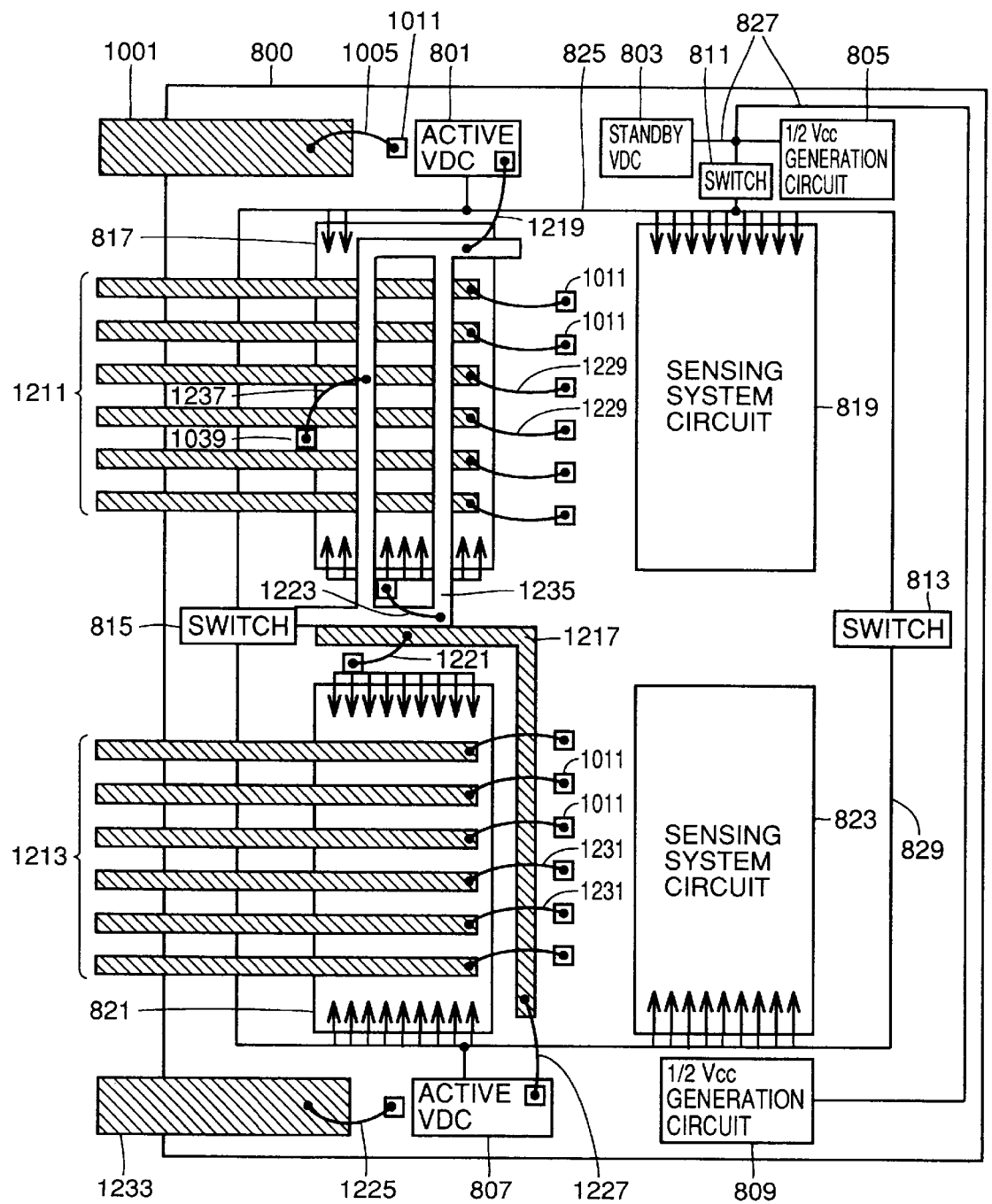
FIG. 26 is schematic block diagram showing another modification of the semiconductor device according to the twelfth embodiment of the present invention.

FIG. 26 is a schematic block diagram showing another modification of the semiconductor device according to the twelfth embodiment.

The above-mentioned another modification of the twelfth embodiment shown in FIG. 26 includes a wire 1237 and a pad 1239 additionally provided to the structure of the modification of the twelfth embodiment shown in FIG. 25. In addition, a first internal lead 1235 replaces first internal lead 1215 in FIG. 25. The portions identical to those in FIG. 25 are indicated by the same reference numerals and description thereof will not be repeated.

First internal lead 1235 is formed as a frame. Similarly to the structure in FIG. 25, a plurality of external leads 1211 and first internal lead 1235 are provided in different layers. First internal leads 1235 and pad 1039 provided at a gap between external leads 1211 on the chip are connected by wire 1237.

As described above, in the above another modification of the twelfth embodiment of the present invention, wires can be provided at any place on the upper surface of first internal lead 1235 extending two-dimensionally. Thus, connection to a pad provided as desired on the chip can be achieved, thereby allowing application of the internal power supply potential to a desired point on the chip. The other effects are similar to those in the modification of the twelfth embodiment shown in FIG. 25.

Embodiment 13

Figure 27:
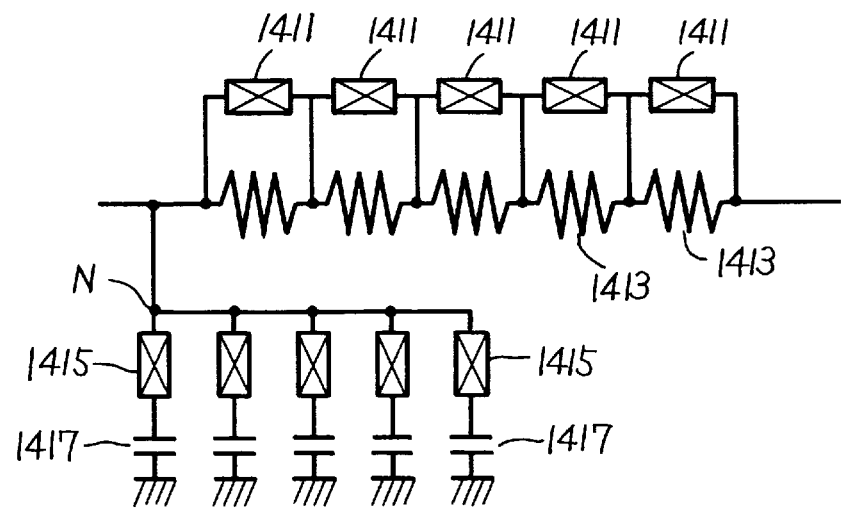
FIG. 27 a circuit diagram showing in detail a filter according to a thirteenth embodiment of the present invention.

FIG. 27 is a circuit diagram showing in detail a structure of a filter according to a thirteenth embodiment of the present invention.

Referring to FIG. 27, the filter according to the thirteenth embodiment includes a plurality of first fuses 1411, a plurality of resistors 1413, a plurality of second fuses 1415, and a plurality of capacitors 1417. The filter shown in FIG. 27 forms a lowpass filter.

A plurality of resistors 1413 are connected in series. First fuses 1411 are each connected in parallel to each of the plurality of resistors 1413. Each of the plurality of second fuses 1415 and each of the plurality of capacitors 1417 are connected in series between a node N and the ground. Node N is connected to one end of the plurality of resistors 1413 connected in series.

First fuse 1411 is made of polysilicon or the like. Therefore, since each of the plurality of resistors 1413 is connected to each of the plurality of first fuses 1411 formed of, for example, polysilicon, each of the plurality of resistors 1413 does not function as a resistor. First fuse 1411 of, for example, polysilicon is blown out with a laser or the like. Resistor 1413 corresponding to the blown-out first fuse 1411 functions as a resistor. Therefore, the total resistance value of the filter can be adjusted by the number of first fuses 1411 to blow out.

The plurality of capacitors 1417 are each connected to node N through each of the plurality of second fuses 1415, and the plurality of capacitors 1417 function as a capacitor. A plurality of second fuses 1415 are formed of, for example, polysilicon, similarly to first fuse 1411. Second fuse 1415 formed of, for example, polysilicon is blown out with a laser or the like.

Capacitor 1417 corresponding to the blown-out second fuse 1415 is then disconnected from node N. Therefore, the disconnected capacitor 1417 does not function as a capacitor. As a result, the total capacitance value of the filter can be adjust by the number of the second fuses to blow out.

As described above, in the filter according to the thirteenth embodiment of the present invention, the plurality of resistors 1413 are each connected to each of the plurality of first fuses 1411 in parallel, and the plurality of capacitors 1417 are each connected to each of the plurality of second fuses 1415 in series. Consequently, the total resistance value and capacitance value of the filter can be adjusted by the number of first fuses 1413 or second fuses 1415 to blow out.

The filter according to the thirteenth embodiment can be employed as the lowpass filter or the filter shown in FIGS. 3, 7, 9, 10, 11, 15 and 24.

The first through thirteenth embodiment can be combined as desired in the paths from the package frame (lead) of the semiconductor device to the node in the internal circuit of the semiconductor device which receives a prescribed potential or a prescribed signal. By such combination, multiple effects of the embodiments can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a first internal circuit formed on a semiconductor substrate and causing noise;
   a second internal circuit formed on said semiconductor substrate and affected by said noise;
   a first power supply potential provision line for providing a first power supply potential;
   a second power supply potential provision line having one end connected to said first power supply potential provision line and providing said first internal circuit with said first power supply potential;
   a third power supply potential provision line having one end connected to said first power supply potential provision line and providing said second internal circuit with said first power supply potential; and
   a first filter provided at said third power supply potential provision line for reducing said noise.

2. The semiconductor device according to claim 1, further comprising:
   a fourth power supply potential provision line for providing a second power supply potential different from said first power supply potential;
   a fifth power supply potential provision line having one end connected to said fourth power supply potential provision line for providing said first internal circuit with said second power supply potential;
   a sixth power supply potential provision line having one end connected to said fourth power supply potential provision line for providing said second internal circuit with said second power supply potential; and a second filter provided at said sixth power supply potential provision line for reducing said noise.

3. The semiconductor device according to claim 1, further comprising:
   a potential fixing layer formed on said semiconductor substrate at a region where said second internal circuit is formed for fixing a potential of said semiconductor substrate at the region where said second internal circuit is formed; and
   a fourth power supply potential provision line having one end connected to said third power supply potential provision line and providing said potential fixing layer with said first power supply potential; wherein
   said fourth power supply potential provision line is connected to said third power supply potential provision line through said first filter so that said first power supply potential is provided to said potential fixing layer.

4. The semiconductor device according to claim 1, further comprising:
   a potential fixing layer formed on said semiconductor substrate at a region where said second internal circuit is formed for fixing a potential of said semiconductor substrate at the region where said second internal circuit is formed;
   a fourth power supply potential provision line having one end connected to said first power supply potential provision line and providing said first power supply potential to said potential fixing layer; and
   a third filter provided at said fourth power supply potential provision line for reducing said noise.

5. The semiconductor device according to claim 1, wherein said first filter includes
   a resistance element serving as a resistor, and
   a capacitive element serving as a capacitor.

6. The semiconductor device according to claim 5, wherein
   said resistance element includes a plurality of resistance members connected in series;
   said capacitive element includes a plurality of capacitors connected in parallel;
   said first filter further includes
      a plurality of first fuse elements connected in parallel to said plurality of resistance members, and
      a plurality of second fuse elements connected in series to said plurality of capacitors; wherein
   when said first fuse element is blown out, said resistance member corresponding thereto serves as a resistor, and
   when said second fuse elements is blown out, said capacitor corresponding thereto does not serve as a capacitor.

7. The semiconductor device according to claim 4, wherein said third filter includes
   a resistance element serving as a resistor, and
   a capacitive element serving as a capacitor.

8. The semiconductor device according to claim 7, wherein
   said resistance element includes a plurality of resistance members connected in series;
   said capacitive element includes a plurality of capacitors connected in parallel;
   said third filter further includes
      a plurality of first fuse elements connected in parallel to said plurality of resistance members, and
      a plurality of second fuse elements connected in series to said plurality of capacitors; wherein
   when said first fuse element is blown out, said resistance member corresponding thereto serves as a resistor, and
   when said second fuse element is blown out, said capacitor corresponding thereto does not serve as a capacitor.

9. A semiconductor device, comprising:
   a first internal circuit causing noise;
   a second internal circuit affected by said noise;
   internal potential generation means for generating an internal potential;
   a first internal potential provision line for providing said internal potential;
   a second internal potential provision line having one end connected to said first internal potential provision line and providing said first internal circuit with said internal potential;
   a third internal potential provision line having one end connected to said first internal potential provision line and providing said second internal circuit with said internal potential; and
   a filter provided at said third internal potential provision line for reducing said noise.

10. A semiconductor device, comprising:
   a first internal circuit causing noise;
   a second internal circuit affected by said noise;
   first internal potential generation means for generating a first internal potential to be provided to said first internal circuit;
   second internal potential generation means for generating a second internal potential to be provided to said second internal circuit;
   a power supply potential provision line for providing a power supply potential to said first internal potential generation means and said second internal potential generation means;
   a first internal potential provision line for providing said first internal circuit with said first internal potential; and
   a second internal potential provision line for providing said second internal circuit with said second internal potential.

11. The semiconductor device according to claim 10, wherein said first internal potential generation means includes
   third internal potential generation means for generating a third internal potential when said semiconductor device is in an operative state, and
   fourth internal potential generation means for generating a fourth internal potential when said semiconductor device is in a standby state; wherein
   said third internal potential is said first internal potential when said semiconductor device is in an operative state;
   said fourth internal potential is said first internal potential when said semiconductor device is in the standby state;
   said first internal potential provision line includes
      a third internal potential provision line for providing said third internal potential,
      a fourth internal potential provision line for providing said fourth internal potential,
      a fifth internal potential provision line for providing said third and fourth internal potentials; wherein
   respective one ends of said third internal potential provision line, said fourth internal potential provision line and said fifth internal potential provision line are connected in common;

said fifth internal potential provision line has another end connected to said first internal circuit; and said second internal potential generation means provides said second internal circuit with said second internal potential when said semiconductor device is in the standby state.

12. A semiconductor device, comprising:

a first internal circuit causing noise;

a second internal circuit affected by said noise;

first internal potential generation means for generating a first internal potential to be provided to said first internal circuit;

a first internal potential provision line for providing said first internal potential to said first internal circuit;

second internal potential generation means for generating a second internal potential to be provided selectively to said second internal circuit or both said first and second internal circuits;

a second internal potential provision line for providing said second internal potential selectively to said second internal circuit or both said first and second internal circuits; and connection control means for controlling connection of said first internal circuit with said first internal potential provision line or said second internal potential provision line in accordance with a state of said semiconductor device.

13. The semiconductor device according to claim 12, wherein said connection control means disconnects said first internal circuit and said second internal potential provision line and connects said first internal circuit and said first internal potential provision line when said semiconductor device is in an operative state, and said connection control means disconnects said first internal circuit and said first internal potential provision line and connects said first internal circuit and said second internal potential provision line when said semiconductor device is in a standby state.

14. A semiconductor device, comprising:

a first internal circuit causing noise;

a second internal circuit affected by said noise;

first internal potential generation means for generating a first internal potential to be provided to said first internal circuit and said second internal circuit when said semiconductor device is in an operative state;

second internal potential generation means for generating a second internal potential to be provided to said first and second internal circuits when said semiconductor device is in a standby state;

a first internal potential provision line for providing said first internal potential;

a second internal potential provision line for providing said second internal potential;

a third internal potential provision line connected between said first internal potential provision line and said second internal potential provision line; and a filter provided at said third internal potential provision line for reducing said noise; wherein said third internal potential provision line provides one of said first and second internal potentials.

15. A semiconductor device, comprising:

a first internal circuit causing first noise;

a second internal circuit affected by said first noise;

first internal potential generation means for generating a first internal potential to be provided to said first internal circuit;

second internal potential generation means for generating a second internal potential to be provided to said second internal circuit;

a first internal potential provision line for connecting said first internal potential generation means and said first internal circuit and providing said first internal potential;

a second internal potential provision line for connecting said second internal potential generation means and said second internal circuit and providing said second internal potential; and first connection control means provided between said first and second internal potential provision lines for controlling connection between said first and second internal potential provision lines in accordance with a state of said semiconductor device.

16. The semiconductor device according to claim 15, wherein said first connection control means disconnects said first internal potential provision line and said second internal potential provision line when said semiconductor device is in a first state, said first connection control means connects said first internal potential provision line with said second internal potential provision line when said semiconductor device is in a second state, and said second internal potential generation means also provides said first internal circuit with said second internal potential when said semiconductor device is in said second state.

17. The semiconductor device according to claim 16, wherein said first state is an operative state of said semiconductor device, said second state is a standby state of said semiconductor device, and said first internal potential generation means is stopped in said standby state.

18. The semiconductor device according to claim 16, wherein said first state is a first operative state of said semiconductor device, and said second state is a second operative state of said semiconductor device.

19. The semiconductor device according to claim 15, further comprising a resistance element connected between said first internal potential provision line and said second internal potential provision line.

20. The semiconductor device according to claim 15, further comprising:

a third internal circuit causing second noise;

third internal potential generation means for generating a third internal potential to be provided to said third internal circuit;

a third internal potential provision line for connecting said third internal potential generation means and said internal circuit and providing said third internal potential; and second connection control means provided between said second and third internal potential provision lines and controlling connection between said second and third internal potential provision lines in accordance with a state of said semiconductor device.

21. The semiconductor device according to claim 20, further comprising a resistance element connected between said second and third internal potential provision lines.

22. The semiconductor device according to claim 15, further comprising:
a third internal circuit causing second noise;
third internal potential generation means for generating a third internal potential to be provided to said third internal circuit;
a third internal potential provision line for connecting said third internal circuit and said third internal potential generation means and providing said third internal potential; and
second connection control means provided between said first and third internal potential provision lines for controlling connection between said first and third internal potential provision lines in accordance with a state of said semiconductor device.

23. A semiconductor device, comprising:
a first internal circuit affected by noise;
a first potential provision member for providing a potential to said first internal circuit;
an internal lead connected in series with said first potential provision member for providing said potential to said first internal circuit; and
a second potential provision member connected in series with said internal lead for providing said potential to said first internal circuit; wherein
said internal lead does not have a connection portion with outside of said semiconductor device for providing and receiving a voltage to and from the outside of said semiconductor device and is thicker than an internal interconnection of said semiconductor device.

24. The semiconductor device according to claim 23, further comprising:
a second internal circuit causing said noise;
internal potential generation means for generating an internal potential to be provided to said second internal circuit; and
potential provision means for providing said potential to said first internal circuit and said internal potential generation means from the outside of said semiconductor device; wherein
said first potential provision member is connected to said potential provision means.

25. The semiconductor device according to claim 23, wherein
said first potential provision member or said second potential provision member is a wire having inductance.

26. A semiconductor device, comprising:
an external lead having a connection portion with outside for directly providing and receiving a voltage to and from the outside of said semiconductor device; and
an internal lead which does not have a connection portion with the outside for directly providing and receiving a voltage to and from the outside of said semiconductor device; wherein
said external lead and said internal lead are thicker than an internal interconnection of said semiconductor device.

27. The semiconductor device according to claim 26, wherein
said external lead is provided at a first layer, and
said internal lead is provided at a second layer.

28. The semiconductor device according to claim 27, wherein
said internal lead includes a first internal lead and a plurality of second internal leads branched from said first internal lead.

29. The semiconductor device according to claim 28, further comprising an internal circuit for providing and receiving a voltage to and from said internal lead, wherein
said external lead and said internal lead are provided at an upper layer of said internal circuit to avoid direct contact with said internal circuit, and
said semiconductor device further comprising a connection member for connecting said internal lead and said internal circuit to avoid contact with said external lead.

30. The semiconductor device according to claim 27, wherein said internal lead forms at least one frame.

31. The semiconductor device according to claim 30, further comprising an internal circuit for providing and receiving a voltage to and from said internal lead, wherein
said external lead and said internal lead are provided at an upper layer of said internal circuit to avoid direct contact with said internal circuit, and
said semiconductor device further comprising a connection member for connecting said internal lead and said internal circuit to avoid contact with said external lead.

32. A semiconductor apparatus comprising:
a semiconductor device contained within a package and having an internal interconnection formed thereon;
an external lead thicker than said internal interconnection and partially exposed to outside of said package;
an internal lead thicker than said internal interconnection and wholly buried inside of said package; and
a wire connected between said external lead and said internal lead.

33. A semiconductor apparatus comprising:
a semiconductor device contained within a package and having an internal interconnection formed thereon;
an external lead thicker than said internal interconnection and partially exposed to outside of said package; and
an internal lead thicker than said internal interconnection and wholly buried inside of said package wherein
said external lead receives an external power supply potential,
said semiconductor device includes
an internal potential generating circuit receiving said external power supply potential from said internal lead and generating an internal potential different from said external power supply potential.

34. A semiconductor apparatus comprising:
a semiconductor device contained within a package and having an internal interconnection formed thereon;
an external lead thicker than said internal interconnection and partially exposed to outside of said package; and
an internal lead thicker than said internal interconnection and wholly buried inside of said package wherein
said external lead receives an external power supply potential,
said semiconductor device includes
an internal potential generating circuit connected to said internal lead, generating and providing an internal potential different from said external power supply potential to said internal lead.

35. The semiconductor apparatus according to claim 34, wherein said semiconductor device further includes an internal circuit connected to said internal lead and operating in response to said internal potential from said internal lead.

* * * * *